United States Patent
Achanta

(10) Patent No.: US 10,649,020 B2
(45) Date of Patent: May 12, 2020

(54) HIGH-IMPEDANCE FAULT DETECTION USING COORDINATED DEVICES

(71) Applicant: Schweitzer Engineering Laboratories, Inc., Pullman, WA (US)

(72) Inventor: Shankar V. Achanta, Pullman, WA (US)

(73) Assignee: Schweitzer Engineering Laboratories, Inc., Pullman, WA (US)

(*) Notice: Subject to any disclaimer, the term of this patent is extended or adjusted under 35 U.S.C. 154(b) by 528 days.

(21) Appl. No.: 15/590,164

(22) Filed: May 9, 2017

(65) Prior Publication Data

US 2017/0328945 A1 Nov. 16, 2017

Related U.S. Application Data

(60) Provisional application No. 62/337,192, filed on May 16, 2016.

(51) Int. Cl.

| | | |
|---|---|---|
| *G01R 31/08* | (2020.01) | |
| *H02H 3/08* | (2006.01) | |
| *H02H 3/52* | (2006.01) | |
| *H02H 7/26* | (2006.01) | |
| *H02H 3/033* | (2006.01) | |

(52) U.S. Cl.
CPC ........... *G01R 31/085* (2013.01); *H02H 3/033* (2013.01); *H02H 3/08* (2013.01); *H02H 3/52* (2013.01); *H02H 7/261* (2013.01)

(58) Field of Classification Search
CPC ...... G01R 31/085; H02H 1/0015; H02H 3/08; H02H 3/52; H02H 3/033; H02H 7/261
USPC .......................................................... 361/42
See application file for complete search history.

(56) References Cited

U.S. PATENT DOCUMENTS

| | | | |
|---|---|---|---|
| 7,023,691 B1* | 4/2006 | Feight | G01R 31/024 324/239 |
| 2008/0012720 A1 | 1/2008 | Rostron | |
| 2009/0079417 A1 | 3/2009 | Mort | |
| 2010/0085036 A1* | 4/2010 | Banting | G01R 15/14 324/127 |
| 2013/0050882 A1 | 2/2013 | Rostron | |
| 2014/0104738 A1* | 4/2014 | Schweitzer, III | H02H 3/08 361/87 |
| 2014/0280714 A1* | 9/2014 | Dolezilek | H04L 69/08 709/217 |

* cited by examiner

*Primary Examiner* — Kevin J Comber
(74) *Attorney, Agent, or Firm* — Justin K. Flanagan; Richard M. Edge

(57) ABSTRACT

A conductor-mounted device (CMD) used to signal an intelligent electronic device (IED) of the existence of a fault on a portion of the electric power delivery system is described herein. The CMD may provide a heartbeat signal to the IED. The CMD may provide a fault signal to the IED. The CMD may be powered via a parasitic current draw on the conductor to which it is mounted. An IED may use a fault signal and/or LOC signal from a CMD to coordinate a high-impedance fault detection and/or downed line events.

23 Claims, 15 Drawing Sheets

HIGH-IMPEDANCE FAULT DETECTION USING COORDINATED DEVICES

RELATED APPLICATIONS

This application claims priority under 35 U.S.C. § 119(e) to U.S. Provisional Patent Application No. 62/337,192, filed May 16, 2016, titled "High-Impedance Fault Detection Using Coordinated Devices," which is hereby incorporated by reference in its entirety.

TECHNICAL FIELD

This disclosure relates to detection of high-impedance faults in electric power delivery systems using coordinated devices. This disclosure further relates to detection of high-impedance faults in an electric power delivery system using coordinated intelligent electronic devices and conductor-mounted devices.

BRIEF DESCRIPTION OF THE DRAWINGS

This disclosure includes illustrative embodiments that are non-limiting and non-exhaustive. Reference is made to certain of such illustrative embodiments that are depicted in the figures described below.

DETAILED DESCRIPTION

Figure 1:
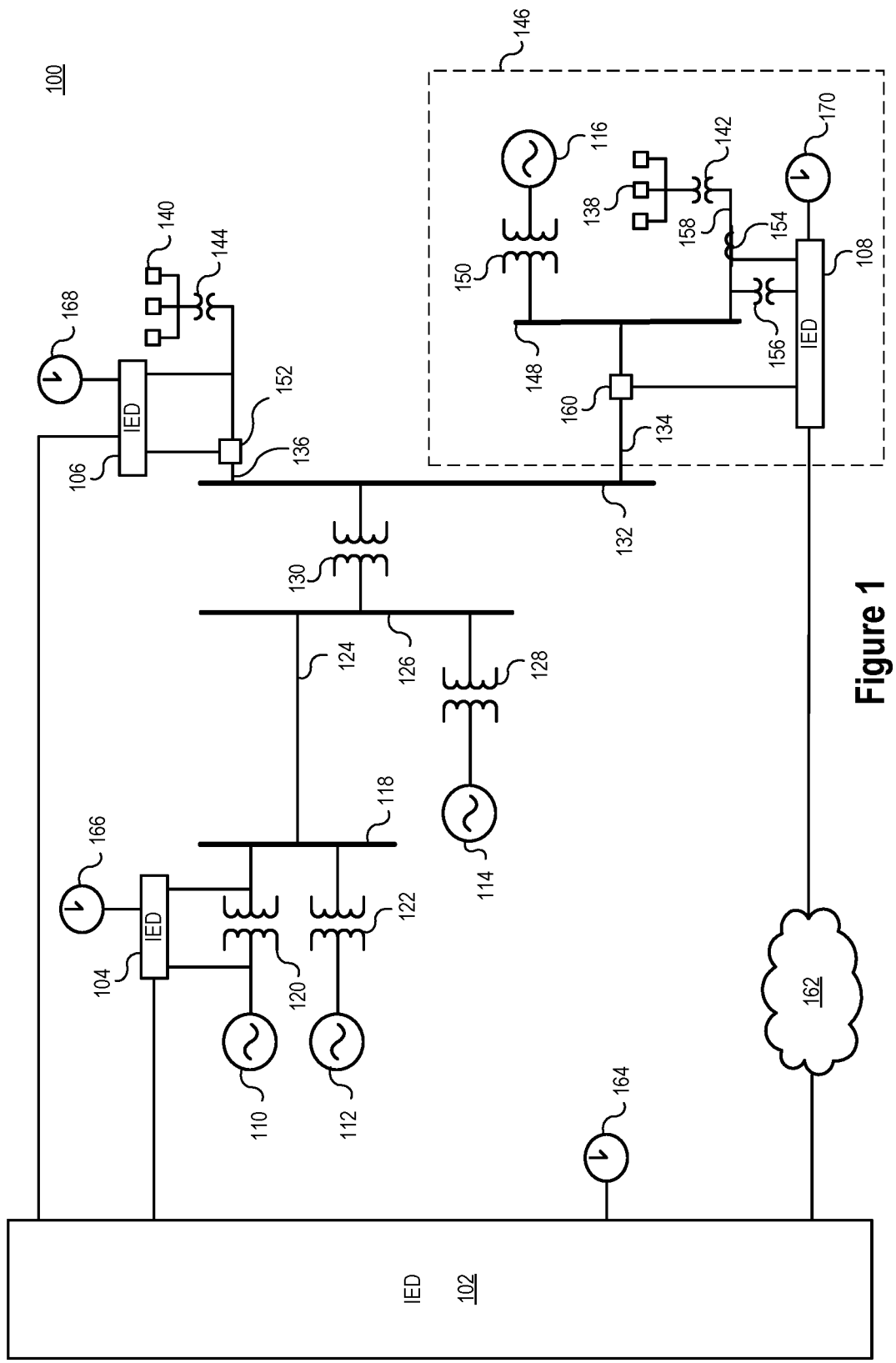
FIG. 1 illustrates a simplified diagram of one embodiment of an electric power delivery system that includes intelligent electronic devices consistent with embodiments disclosed herein.

Electrical power generation and delivery systems are designed to generate, transmit, and distribute electrical energy to loads. Electrical power generation and delivery systems may include a variety of equipment, such as electrical generators, electrical motors, power transformers, power transmission and distribution lines, circuit breakers, switches, buses, transmission and/or feeder lines, voltage regulators, capacitor banks, and the like. Such equipment may be monitored, controlled, automated, and/or protected using intelligent electronic devices (IEDs) that receive electric power system information from the equipment, make decisions based on the information, and provide monitoring, control, protection, and/or automation outputs to the equipment. For example, an IED may receive multiple inputs and a protective action determination component may determine a protective action to be taken based on the combination of inputs.

In some embodiments, an IED may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communication processors, computing platforms, programmable logic controllers (PLCs), programmable automation controllers, input and output modules, governors, exciters, statcom controllers, static var compensator (SVC), on-load tap-changer (OLTC) controllers, and the like. Further, in some embodiments, IEDs may be communicatively connected via a network that includes, for example, multiplexers, routers, hubs, gateways, firewalls, and/or switches to facilitate communications on the networks, each of which may also function as an IED. Networking and communication devices may also be integrated into an IED and/or be in communication with an IED. As used herein, an IED may include a single discrete IED or a system of multiple IEDs operating together.

Electrical power delivery system equipment may be monitored and protected from various malfunctions and/or conditions using one or more IEDs. For example, an IED may be configured to detect and protect the electrical power system equipment from abnormal conditions, such as high-impedance fault (HIF) events. HIF events may occur, for example, on a distribution feeder line of an electric power delivery system due to a variety of conditions. For example, downed feeder lines, intrusion onto a line (e.g., as may occur when a tree or other object contacts the line), and/or the like may cause HIF events.

HIF events may pose a safety risk and/or damage an electrical power delivery system and/or its constituent components. Accordingly, detecting HIF events and implementing one or more suitable protective actions (e.g., disconnecting a portion of an electrical power delivery system experiencing an HIF) may mitigate potential harm caused by damage an electrical power delivery system. HIF event detection may utilize a variety of techniques and/or algorithms, including the techniques detailed in U.S. Pat. Nos. 7,720,619 and 7,945,400, both assigned to Schweitzer Engineering Laboratories, Inc. and incorporated herein by reference in their entireties. In certain circumstances, HIF events may be difficult to detect because HIF events may not introduce overcurrent conditions sufficient to trigger a detection element of a protective IED. Additional descriptions of related systems and methods can be found in U.S. Pat. No. 9,160,158, which is also hereby incorporated by reference in its entirety.

IEDs monitoring a portion of an electrical power delivery system located nearer to an HIF may be better able to detect the HIF event due to their proximity to the fault. For example, an IED monitoring a portion of an electrical power delivery system located nearer to an HIF may observe relatively larger overcurrent and/or interharmonic and/or other signals associated with the fault condition than an IED monitoring a portion of the system located further from the fault. In certain embodiments, an interharmonic may comprise signals with frequencies that are not integer multiples of a fundamental frequency of the electric power delivery system. For example, in North America, the fundamental frequency of typical electric power delivery systems is 60 Hz. Accordingly, harmonic frequencies in such systems include 120 Hz, 180 Hz, 240 Hz, etc. Interharmonic frequencies are those frequencies other than harmonic frequencies and/or fundamental frequencies.

Consistent with embodiments disclosed herein, a plurality of IEDs may be utilized in connection with HIF event detection to more accurately detect HIF events and implement suitable protective actions to mitigate potentially unsafe conditions and damage to the electrical power delivery system. In certain embodiments, utilizing a plurality of IEDs to detect HIF events may allow for a more accurate determination of a location of the HIF event.

It is appreciated that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment. Features, functionalities, and elements described in the context of one embodiment can be utilized in conjunction with other embodiments as well.

The phrases "connected to" and "in communication with" refer to any form of interaction between two or more components, including mechanical, electrical, magnetic, and electromagnetic interaction. Two components may be connected to each other, even though they are not in direct contact with each other, and even though there may be intermediary devices between the two components.

As used herein, the term "IED" may refer to any microprocessor-based device that monitors, controls, automates, and/or protects monitored equipment within a system. Such devices may include, for example, remote terminal units, differential relays, distance relays, directional relays, feeder relays, overcurrent relays, voltage regulator controls, voltage relays, breaker failure relays, generator relays, motor relays, automation controllers, bay controllers, meters, recloser controls, communications processors, computing platforms, programmable logic controllers (PLCs), programmable automation controllers, input and output modules, motor drives, and the like. IEDs may be connected to a network, and communication on the network may be facilitated by networking devices including, but not limited to, multiplexers, routers, hubs, gateways, firewalls, and switches. Furthermore, networking and communication devices may be incorporated in an IED or be in communication with an IED. The term "IED" may be used interchangeably to describe an individual IED or a system comprising multiple IEDs.

Some of the infrastructure that can be used with embodiments disclosed herein is already available, such as: general-purpose computers, computer programming tools and techniques, digital storage media, and communications networks. A computer may include a processor, such as a microprocessor, microcontroller, logic circuitry, or the like. The processor may include a special purpose processing device, such as an ASIC, PAL, PLA, PLD, Field Programmable Gate Array, or other customized or programmable device. The computer may also include a computer-readable storage device, such as non-volatile memory, static RAM, dynamic RAM, ROM, CD-ROM, disk, tape, magnetic, optical, flash memory, or other computer-readable storage medium.

Suitable networks for configuration and/or use, as described herein, include any of a wide variety of network infrastructures. Specifically, a network may incorporate landlines, wireless communication, optical connections, various modulators, demodulators, small form-factor pluggable (SFP) transceivers, routers, hubs, switches, and/or other networking equipment.

The network may include communications or networking software, such as software available from Novell, Microsoft, Artisoft, and other vendors, and may operate using TCP/IP, SPX, IPX, SONET, and other protocols over twisted pair, coaxial, or optical fiber cables, telephone lines, satellites, microwave relays, modulated AC power lines, physical media transfer, wireless radio links, and/or other data transmission "wires." The network may encompass smaller networks and/or be connectable to other networks through a gateway or similar mechanism.

Aspects of certain embodiments described herein may be implemented as software modules or components. As used herein, a software module or component may include any type of computer instruction or computer executable code located within or on a computer-readable storage medium. A software module may, for instance, comprise one or more physical or logical blocks of computer instructions, which may be organized as a routine, program, object, component, data structure, etc. that perform one or more tasks or implement particular abstract data types.

A particular software module may comprise disparate instructions stored in different locations of a computer-readable storage medium, which together implement the described functionality of the module. Indeed, a module may comprise a single instruction or many instructions, and may be distributed over several different code segments, among different programs, and across several computer-readable storage media. Some embodiments may be practiced in a distributed computing environment where tasks are performed by a remote processing device linked through a communications network. In a distributed computing environment, software modules may be located in local and/or remote computer-readable storage media. In addition, data being tied or rendered together in a database record may be resident in the same computer-readable storage medium, or across several computer-readable storage media, and may be linked together in fields of a record in a database across a network.

Some of the embodiments of the disclosure can be understood by reference to the drawings, wherein like parts are generally designated by like numerals. The components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments. Well-known structures, materials, or operations are not shown or described in detail to avoid obscuring aspects of this disclosure. In addition, the steps of a method do not necessarily need to be executed in any specific order, or even sequentially, nor need the steps be executed only once, unless otherwise specified.

FIG. 1 illustrates a simplified diagram of an electric power generation and delivery system 100 that includes IEDs 102-108 consistent with embodiments disclosed herein. Although illustrated as a one-line diagram for purposes of simplicity, electrical power generation and delivery system 100 may also be configured as a three phase power system. Moreover, embodiments disclosed herein may be utilized by any electric power generation and delivery system and is therefore not limited to the specific system 100 illustrated in FIG. 1. Accordingly, embodiments may be integrated, for example, in industrial plant power generation and delivery systems, deep-water vessel power generation and delivery systems, ship power generation and delivery systems, distributed generation power generation and delivery systems, utility electric power generation and delivery systems, and the like.

The electric power generation and delivery system 100 may include generation, transmission, distribution, and power consumption equipment. For example, the system 100 may include one or more generators 110-116 that, in some embodiments, may be operated by a utility provider for generation of electrical power for the system 100. Generators 110 and 112 may be coupled to a first transmission bus 118 via step up transformers 120 and 122, which are respectively configured to step up the voltages provided to first transmission bus 118. A transmission line 124 may be coupled between the first transmission bus 118 and a second transmission bus 126. Another generator 114 may be coupled to the second transmission bus 126 via step up transformer 128 which is configured to step up the voltage provided to the second transmission bus 126.

A step down transformer 130 may be coupled between the second transmission bus 126 and a distribution bus 132 configured to step down the voltage provided by the second transmission bus 126 at transmission levels to lower distribution levels at the distribution bus 132. One or more feeders 134, 136 may draw power from the distribution bus 132. The feeders 134, 136 may distribute electric power to one or more loads 138, 140. In some embodiments, the electric power delivered to the loads 138, 140 may be further stepped down from distribution levels to load levels via step down transformers 142 and 144, respectively.

Feeder 134 may feed electric power from the distribution bus 132 to a distribution site 146 (e.g., a refinery, smelter, paper production mill, or the like). Feeder 134 may be coupled to a distribution site bus 148. The distribution site 146 may also include a distributed generator 116 configured to provide power to the distribution site bus 148 at an appropriate level via transformer 150. The distribution site 146 may further include one or more loads 138. In some embodiments, the power provided to the loads 138 from the distribution site bus 148 may be stepped up or stepped down to an appropriate level via transformer 142. In certain embodiments, the distribution site 146 may be capable of providing sufficient power to loads 138 independently by the distributed generator 116, may utilize power from generators 110-114, or my utilize both the distributed generator 116 and one or more of generators 110-114 to provide electric power to the loads.

IEDs 102-108 may be configured to control, monitor, protect, and/or automate the electric power system 100. As used herein, an IED may refer to any microprocessor-based device that monitors, controls, automates, and/or protects monitored equipment within an electric power system. In some embodiments, IEDs 102-108 may gather status information from one or more pieces of monitored equipment. Further, IEDs 102-108 may receive information concerning monitored equipment using sensors, transducers, actuators, and the like. Although FIG. 1 illustrates separate IEDs monitoring a signal (e.g., IED 104) and controlling a breaker (e.g., IED 108), these capabilities may be combined into a single IED.

FIG. 1 illustrates various IEDs 102-108 performing various functions for illustrative purposes and does not imply any specific arrangements or functions required of any particular IED. In some embodiments, IEDs 102-108 may be configured to monitor and communicate information, such as voltages, currents, equipment status, temperature, frequency, pressure, density, infrared absorption, radio-frequency information, partial pressures, viscosity, speed, rotational velocity, mass, switch status, valve status, circuit breaker status, tap status, meter readings, and the like. For example, IEDs 102-108 may be configured to monitor and communicate information relating to overcurrent and/or interharmonic and/or other signal conditions of a monitored line (e.g., a feeder and/or transmission line). Further, IEDs 102-108 may be configured to communicate calculations, such as phasors (which may or may not be synchronized as synchrophasors), events, fault distances, differentials, impedances, reactances, frequency, and the like. IEDs 102-108 may also communicate settings information, IED identification information, communications information, status information, alarm information, and the like. Information of the types listed above, or more generally, information about the status of monitored equipment, may be generally referred to herein as monitored system data.

In certain embodiments, IEDs 102-108 may issue control instructions to the monitored equipment to control various aspects relating to the monitored equipment. For example, an IED (e.g., IED 106) may be in communication with a circuit breaker (e.g., breaker 152), and may be capable of sending an instruction to open and/or close the circuit breaker, thus connecting or disconnecting a portion of a power system. In another example, an IED may be in communication with a recloser and capable of controlling reclosing operations. In another example, an IED may be in communication with a voltage regulator and capable of instructing the voltage regulator to tap up and/or down. Information of the types listed above, or more generally, information or instructions directing an IED or other device to perform a certain action, may be generally referred to as control instructions.

The distributed site 146 may include an IED 108 for monitoring, controlling, and protecting the equipment of the distributed site 146 (e.g., generator 116, transformer 142, etc.). IED 108 may receive monitored system data, including current signals via current transformer (CT) 154 and voltage signals via potential transformer (PT 156) from one or more locations (e.g., line 158) in the distribution site 146. The IED 108 may further be in communication with a breaker 160 coupled between the feeder 134 and the distribution site bus 148. In certain embodiments, the IED 108 may be configurable to cause the breaker 160 to disconnect the distribution site bus 148 from the distribution bus 132, based on monitored system data received via CT 154 and PT 156.

Feeder 136 may be communicatively coupled with an IED 106. The IED 106 may be configured to control a breaker 152 between the loads 140 and the distribution bus 132 based on monitored system data. In some embodiments, the power provided to the loads 140 from the distribution bus 132 may be stepped up or stepped down to an appropriate level via transformer 144. Like the IED 108 of the distribution site 146, monitored system data may be obtained by IED 106 using CTs and/or PTs (not shown).

Other IEDs (e.g., IED 104) may be configured to monitor, control, and/or protect the electric power generation and delivery system 100. For example IED 104 may provide transformer and generator protection to the step-up transformer 120 and generator 110. In some embodiments, IEDs 104-108 may be in communication with another IED 102, which may be a central controller, synchrophasor vector processor, automation controller, programmable logic controller (PLC), real-time automation controller, Supervisory Control and Data Acquisition (SCADA) system, or the like. For example, in some embodiments, IED 102 may be a synchrophasor vector processor, as described in U.S. Patent Application Publication No. 2009/0088990, which is incorporated herein by reference in its entirety. In other embodiments, IED 102 may be a real-time automation controller, such as is described in U.S. Patent Application Publication No. 2009/0254655, which is incorporated herein by reference in its entirety. IED 102 may also be a PLC or any similar device capable of receiving communications from other IEDs and processing the communications there from. In certain embodiments, IEDs 104-108 may communicate with IED 102 directly or via a communications network (e.g., network 162).

The central IED 102 may communicate with other IEDs 104-108 to provide control and monitoring of the other IEDs 104-108 and the power generation and delivery system 100 as a whole. In some embodiments, IEDs 104-108 may be configured to generate monitored system data in the form of time-synchronized phasors (synchrophasors) of monitored currents and/or voltages. In some embodiments, synchrophasor measurements and communications may comply with the IEC C37.118 protocol. In certain embodiments, IEDs 102-108 may receive common time signals for synchronizing collected data (e.g., by applying time stamps for the like). Accordingly, IEDs 102-108 may receive common time signals from time references 164-170 respectively. In some embodiments, the common time signals may be provided using a Global Positioning System (GPS) satellite (e.g., IRIG), a common radio signal such as WWV or WWVB, a network time signal such as IEEE 1588, or the like.

Consistent with embodiments disclosed herein, IEDs 102-108 may be configured to detect and/or identify one or more HIF events from monitored system data. For example, IEDs 102-108 may be configured to receive current information and/or measurements (e.g., current measurements of a transmission and/or a feeder line) and, based on the current information and/or measurements, detect and/or identify HIF fault events. In certain embodiments, the HIF events may be detected and/or identified when monitored current information exhibits overcurrent conditions and/or associated interharmonic and/or harmonic signals. For example, in some embodiments, IEDs 102-108 may be configured to determine when monitored current signals include interharmonic signals associated with an HIF event that exceed one or more thresholds (e.g., thresholds indicating an HIF event). Based on a determination that the interharmonic signals exceed the one or more thresholds, IEDs 102-108 may detect the occurrence of an HIF event.

Although embodiments of the disclosed systems and methods are described herein as utilizing interharmonic content in measured current information to identify HIFs, in further embodiments, a variety of other suitable signals and/or signal content may alternatively and/or additionally be utilized. For example, in some embodiments, odd harmonic content associated with HIF events may be used to identify HIFs. Similarly, embodiments may utilize incremental changes of root mean square (RMS) signal information to identify HIFs.

In some embodiments, thresholds utilized to detect and/or identify HIF events may be adaptively tuned to account for normal system noise levels, thereby increasing the accuracy of HIF event detection and/or identification. For example, as discussed in more detail below, in some embodiments IEDs 102-108 may maintain a dynamic reference over time of interharmonic signals included in measured current signals. This long term reference may be utilized as a threshold for differentiating interharmonic signals attributed to normal system noise from interharmonic signals associated with HIF events.

Consistent with embodiments disclosed herein, a plurality of IEDs 102-108 may be utilized to detect HIF events and implement suitable protective actions to mitigate potentially unsafe conditions and damage to the electrical power delivery system 100. For example, as discussed above, an IED monitoring a portion of the electrical power delivery system 100 located nearer to an HIF may be better able to detect the fault event due to its proximity to the fault. For example, IED 108 may be able to more accurately detect HIF events associated with line 158 and/or the distribution site 146 than another remotely located IED (e.g., IED 104 and/or the like). In certain embodiments, IEDs located nearer to an HIF may be better able to detect the fault event due to higher interharmonic signal-to-noise ratios associated with an HIF event closer to the fault.

Detecting HIF events utilizing a plurality of IEDs may allow for determination of fault localization information relating to the HIF event. Based on relative signal-to-noise ratios associated with an HIF event, the locations of one or more IEDs 102-108 relative to a fault may be determined. For example, if interharmonic signal-to-noise ratios associated with an HIF event measured by a first IED are relatively higher than interharmonic signal-to-noise ratios associated with an HIF event measured by a second IED, it may be determined that the HIF is located nearer to the first IED.

Utilizing a plurality of IEDs 102-108 in the detection of HIF events may allow for prioritized implementation of protective actions by IEDs 102-108. For example, an IED located closer to a fault event may implement certain protective actions (e.g., tripping a breaker or the like) before other IEDs implement protective actions. In certain instances, if such a prioritized protective action resolves an HIF condition, further protective actions may not be necessary. If, however, the HIF condition is not resolved, additional protective may be implemented by the IED and/or other IEDs. Prioritized protective actions may be coordinated by IEDs 102-108 based on coordinated instructions exchanged therebetween. Alternatively or in addition, prioritized protective actions may be coordinated by a central IED 102. For example, based on monitored current information and/or detected HIF events at IEDs 104-108, central IED 102 may identify an IED of IEDs 104-108 located nearer to the fault and instruct the IED to implement one or more suitable protective actions.

Figure 2:
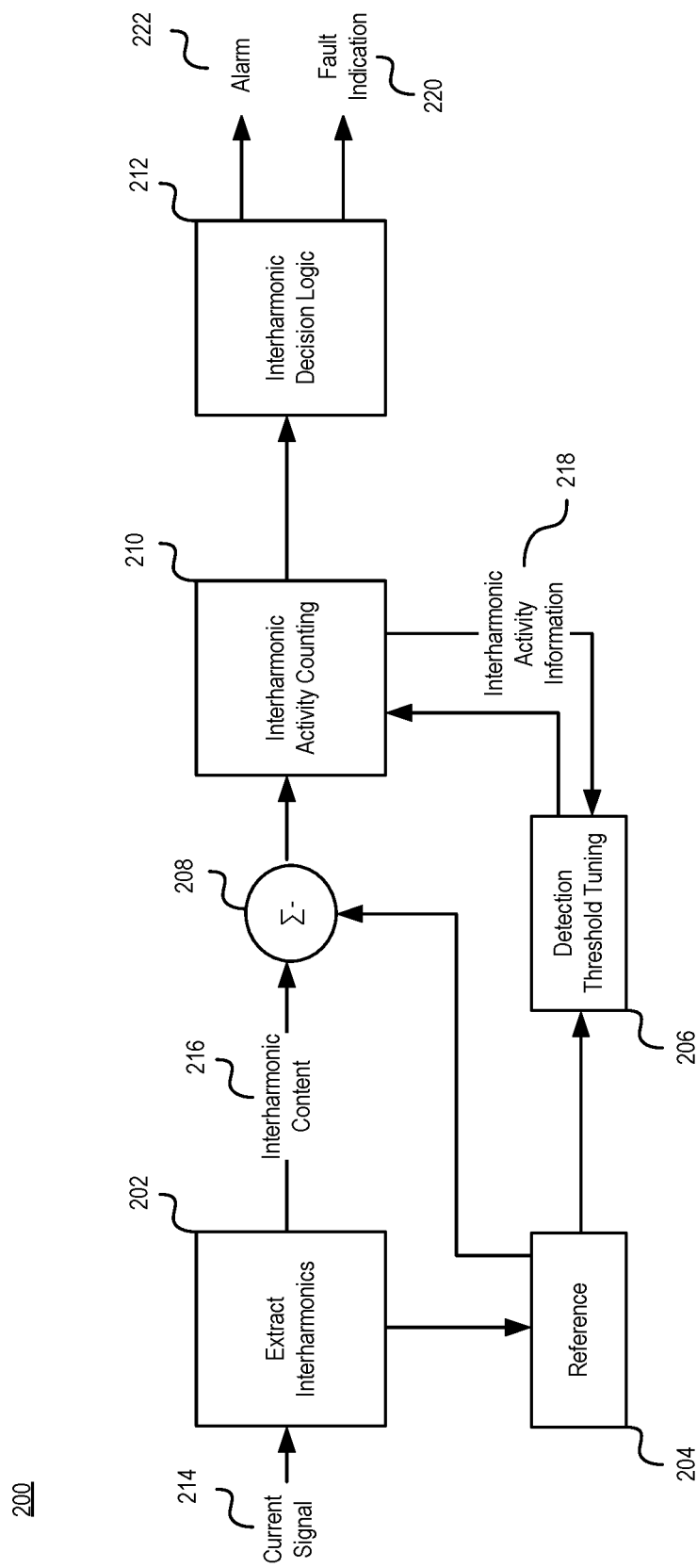
FIG. 2 illustrates a functional block diagram of a system for detecting high-impedance faults consistent with embodiments disclosed herein.

FIG. 2 illustrates a functional block diagram of one embodiment of a system 200 for detecting HIF events. FIG. 2 merely provides one example of such a system and it is appreciated that the high-impedance detection methods described herein may be adapted and/or utilize alternative steps of a method for HIF detection. In certain embodiments, the system 200 may comprise an IED system configured to, among other things, detect HIF events and implement suitable protective actions in response. Components 202-212 of system 200 may be implemented in an IED using hardware, software, firmware, and/or any combination thereof. As illustrated, a current signal 214 may be received as an input to an interharmonic extraction module 202. The current signal 214 may be generated by, for example, a current transformer and/or other associated current measurement device associated with the system 200, and may provide an indication of current flow at a particular location of an electric power delivery system monitored by system 200 (e.g., a location on a feeder line, a transmission line, etc.).

The interharmonic extraction module 202 may extract interharmonic content 216 included in the received current signal 214. Interharmonic content 216 extracted by the interharmonic extraction module 202 over time may be provided to a reference module 204. Based on interharmonic content 216 provided to the reference module 204 over time, the reference module 204 may generate and/or store a dynamically updated reference and/or indication of an amount of interharmonic content (e.g., an average amount) of the received current signal 214 over time. In certain embodiments, this dynamic reference and/or indication may represent an average interharmonic content of received current signals 214 over time associated with normal system noise (e.g., interharmonic signal levels under normal load conditions), and may be utilized in differentiating interharmonic signals attributed to HIF events from interharmonic signals associated with normal system noise.

Difference module 208 may be provided the reference generated by the reference module 204 and the instantaneous extracted interharmonic content signal 216 as inputs, and may calculate a difference between the reference and the instantaneous extracted interharmonic content signal 216. This calculated difference may be indicative of an amount that the instantaneous extracted interharmonic content signal 216 varies from normal system noise levels.

The calculated difference may be provided to an interharmonic activity counting module 210. The interharmonic activity counting module 210 may count a number of occurrences of the difference calculated by the difference module 208 exceeding a defined threshold. In certain embodiments, the defined threshold may be provided by a detection threshold tuning module 206. The threshold maintained and/or provided by the detection threshold tuning module 206 to the interharmonic activity counting module 210 may be calculated by the detection threshold tuning module 206 based on the reference generated by the reference module 204 and/or interharmonic activity information 218 generated by the interharmonic activity counting module 210. Based on this information, the threshold maintained and/or provided by the detection threshold tuning module 206 may be dynamically updated over time.

A number of occurrences of the threshold being exceeded as well as magnitudes of the occurrences may be provided to interharmonic decision logic 212. Based on the magnitudes and the number and/or rates of occurrences of the interharmonic threshold being exceeded, the interharmonic decision logic 212 may identify the occurrence of an HIF event. In response, the interharmonic decision logic 212 may generate an alarm signal 222 and/or a fault signal 220. Based on these signals, system 200 and/or an associated IED or system may implement a suitable protective action (e.g., tripping a breaker to isolate a fault) to mitigate potentially unsafe conditions caused by an HIF event.

Figure 3:
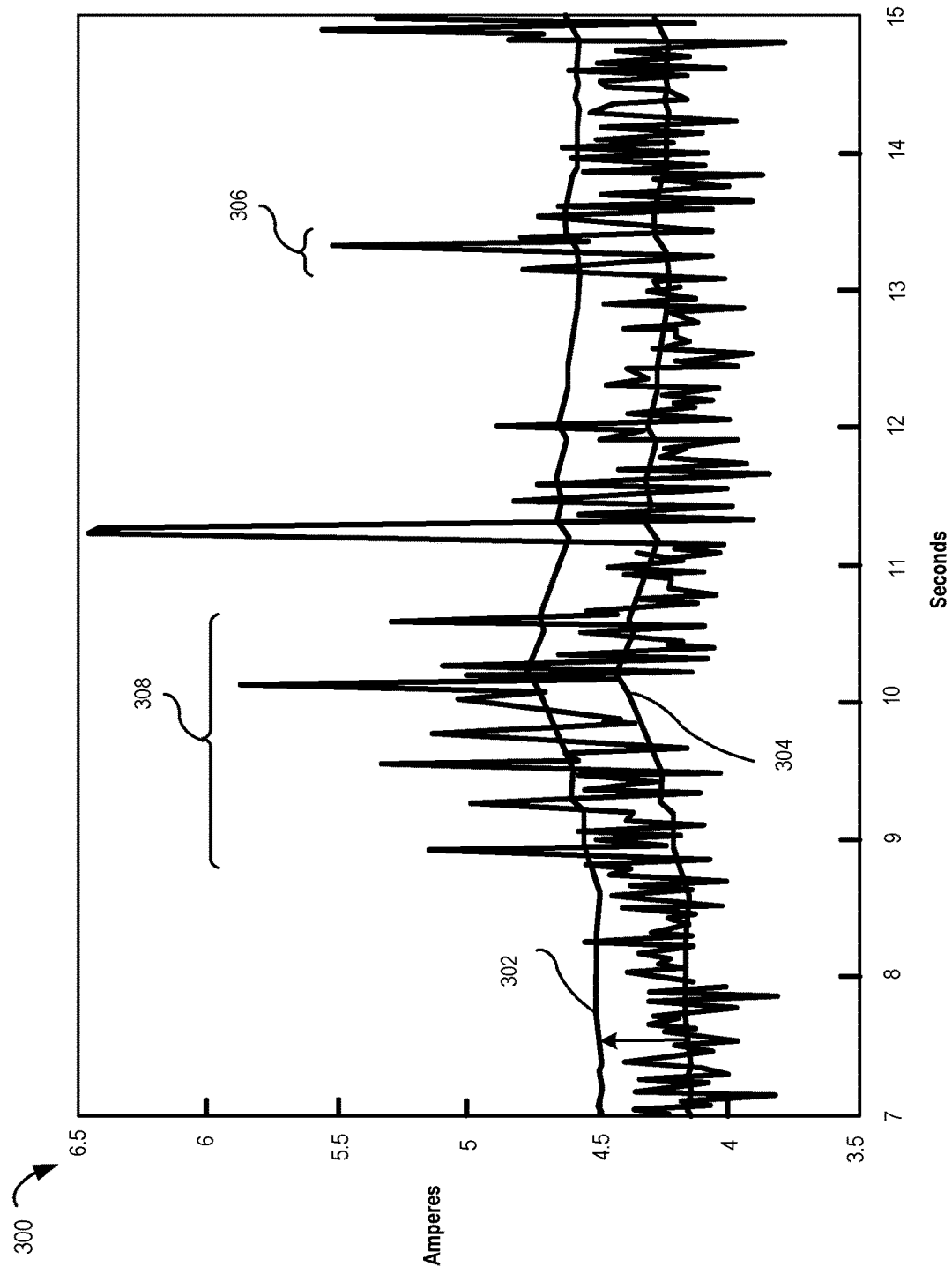
FIG. 3 is a graph illustrating adaptive tuning that may be used in high-impedance fault detection consistent with embodiments disclosed herein.

FIG. 3 is a graph 300 illustrating adaptive tuning used in HIF detection consistent with embodiments disclosed herein. Particularly, the graph 300 illustrates adjustment of HIF detection thresholds 302 based on changes to instantaneous interharmonic content in measured current signals over time. As illustrated, an average of interharmonic content 304 over time of the current signal may be maintained. In certain embodiments, the average over time 304 may be associated with normal system interharmonic noise. An HIF detection threshold 302 may be updated as the average interharmonic content 304 of the signal changes. For example, as illustrated, when the average interharmonic content 304 increases, the HIF detection threshold 302 may also increase.

In certain embodiments, HIF detection logic may identify an HIF event when interharmonic content exceeds the detection threshold 302 by a certain amount and/or by a certain number of times in a given period. For example, as illustrated, interharmonic content during period 308 exceeds the detection threshold 302 frequently by a large magnitude. Such behavior may be indicative of an HIF event, and HIF detection logic may identify the event accordingly. Inharmonic content during period 306, however, exceeds the threshold 302 less frequently, which may not be indicative of an HIF event. Accordingly, the HIF detection logic may not identify an HIF event based on inharmonic activity during period 306.

In certain embodiments, a number of times and/or a duration of a period during which interharmonic content exceeds detection threshold 302 triggering an HIF event, may depend and/or be adjusted based on a magnitude of the interharmonic content exceeding the threshold 302. For example, if interharmonic content exceeds the detection threshold 302 by a relatively large magnitude, a number of threshold crossings and/or a detection period used by HIF detection logic may be relatively small and/or short. Similarly, if interharmonic content exceeds the threshold 302 by a relatively small magnitude, the number of threshold crossings and/or the detection period used by HIF detection logic may be relatively larger and/or long.

Figure 4:
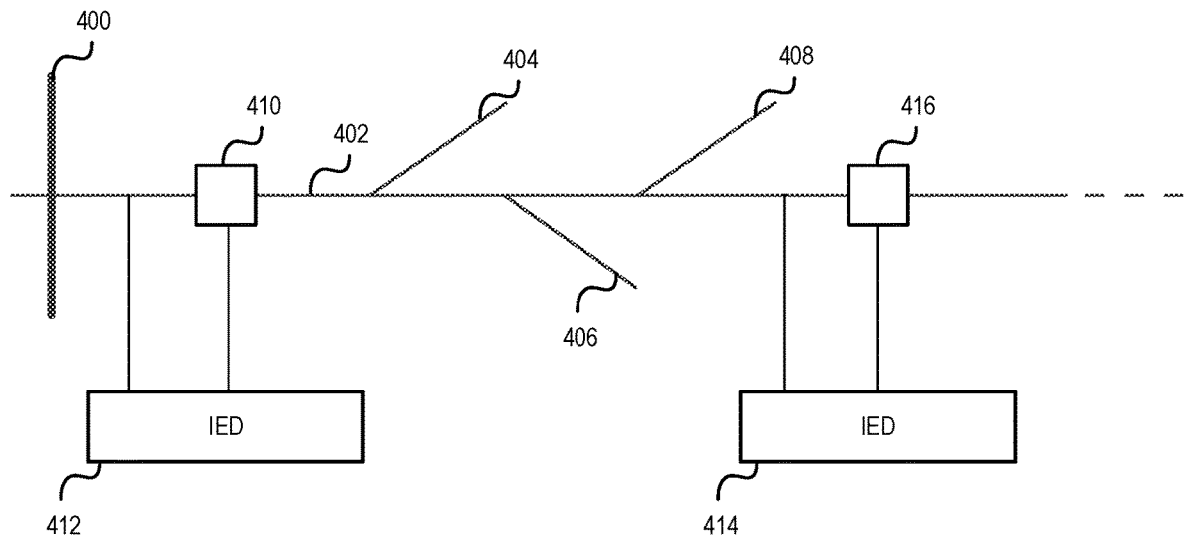
FIG. 4 illustrates a simplified one-line diagram of an electric power delivery system consistent with embodiments disclosed herein.

FIG. 4 illustrates a simplified one-line diagram of an electric power delivery system consistent with embodiments disclosed herein. As illustrated, a distribution bus 400 may be electrically coupled to a distribution feeder line 402 having a plurality of feeder lines 404-408 leading therefrom (e.g., feeder lines leading to one or more loads or the like). IED 412 may monitor certain measured parameters of a location of the feeder line 402 including, among other things, a current flow through the feeder line at the monitored location. For example, IED 412 may be associated with a distribution substation location of an electric power delivery system. IED 412 may be communicatively coupled with a breaker 410 that may be configured to disconnect a portion of the electric power delivery system when actuated by IED 412 (e.g., in response to IED 412 detecting an HIF event or the like). IED 414 may similarly monitor measured parameters (e.g., current) of another location of the feeder line 402 and be configured to actuate (e.g., trip) a communicatively coupled breaker 416 upon detecting an HIF event.

Figure 5:
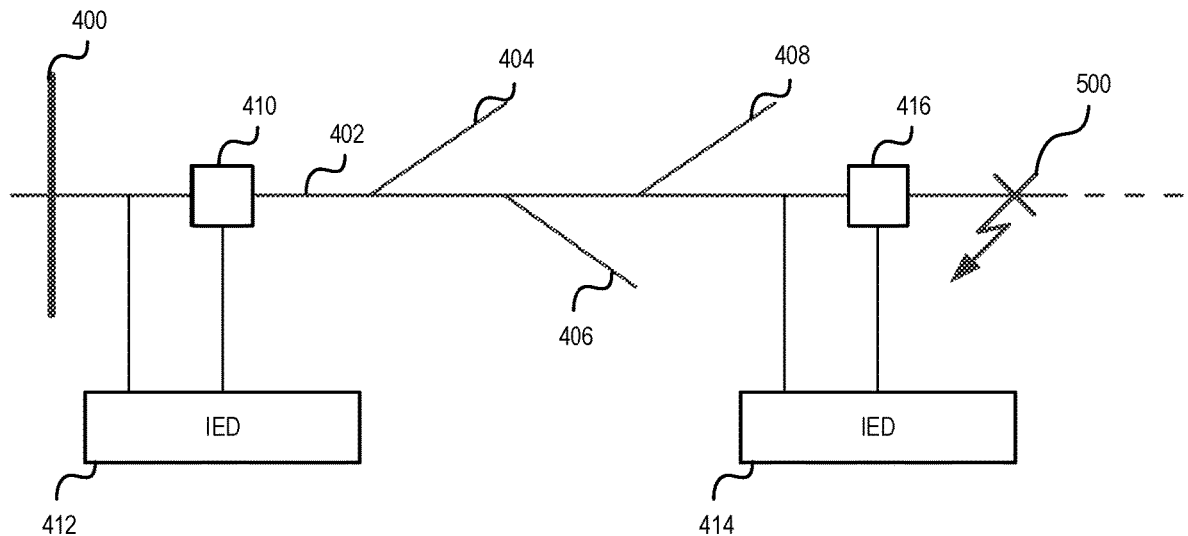
FIG. 5 illustrates a simplified one-line diagram of an electric power delivery system experiencing a high-impedance fault consistent with embodiments disclosed herein.

FIG. 5 illustrates a simplified one-line diagram of an electric power delivery system experiencing an HIF 500 consistent with embodiments disclosed herein. As illustrated, an HIF 500 may occur on the distribution feeder line 402 due to a variety of conditions (e.g., when tree or other object contacts the line and/or when a conductor contacts the ground). IEDs 412, 414 may monitor interharmonic content of measured current signals on the distribution feeder line 402. Based on the monitored interharmonic content, IEDs 412, 414 may identify the occurrence of the HIF event 500 on the distribution feeder line 402 and take one or more suitable protective action to mitigate potentially unsafe conditions and damage to the electric power delivery system. For example, upon detecting the occurrence of the HIF event 500, IED 414 may trip breaker 416, thereby isolating the HIF 500 from the electric power delivery system due to IED 414 monitoring a location further away from the distribution bus 400 than IED 412.

Figure 6:
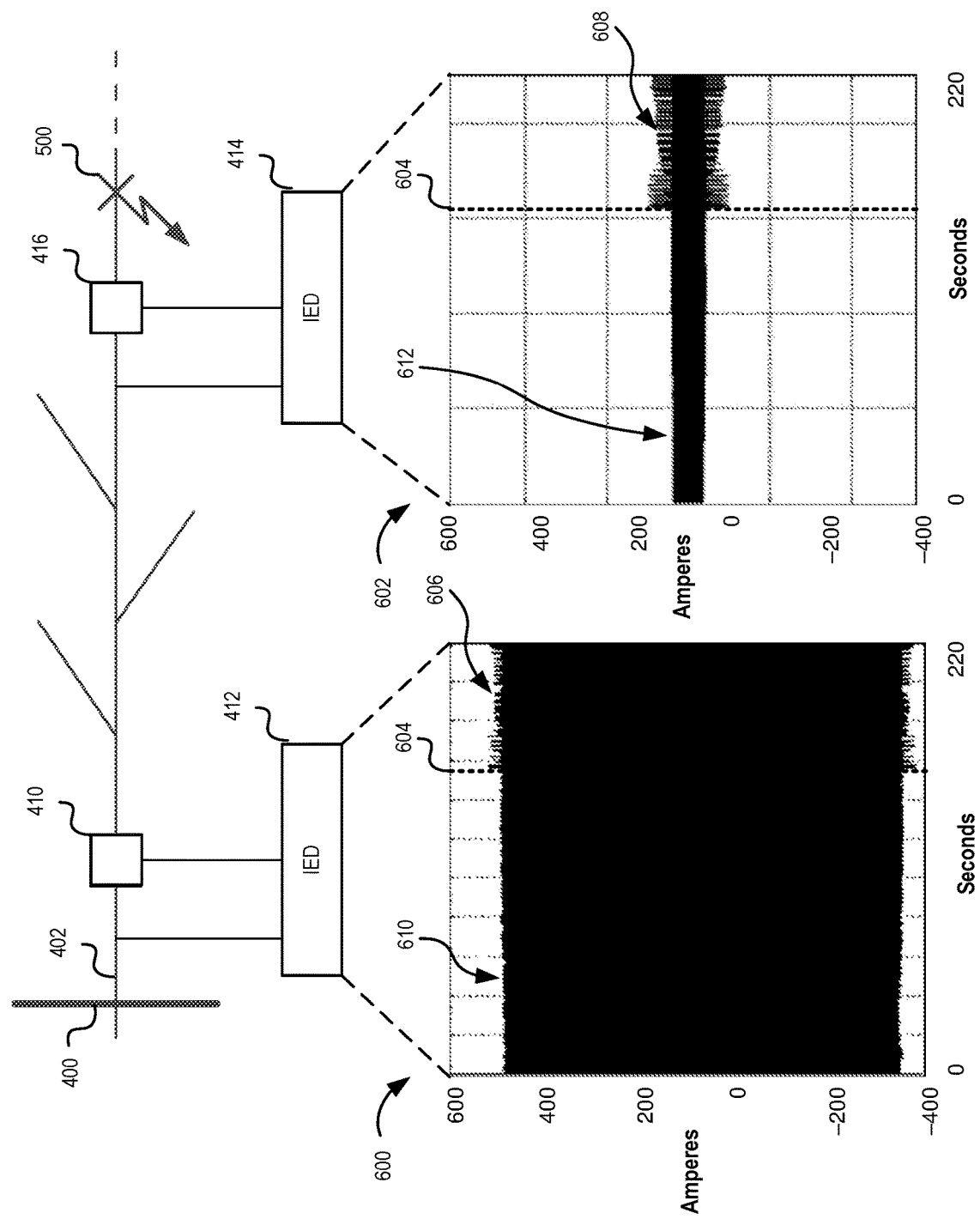
FIG. 6 illustrates exemplary current signals associated with a high-impedance fault at two points in an electric power delivery system consistent with embodiments disclosed herein.

FIG. 6 illustrates exemplary current signals 600, 602 associated with an HIF event 500 and an associated simplified one-line diagram of an electric power delivery system consistent with embodiments disclosed herein. Current signal 600 may represent a current over time measured by IED 412 and current signal 602 may represent a current over time measured by IED 414. As illustrated, current signal 602 measured by IED 414 may be lower than current signal 600 measured by IED 412. For example, due to a plurality of feeder lines being located between the locations monitored by IEDs 412 and 414, the load current measured by IED 414 (e.g., an IED associated with a recloser) may be lower than the load current measured by IED 412 (e.g., an IED associated with a distribution substation).

An HIF 500 may occur on the distribution feeder line 402 at a time 604. As illustrated, the HIF event 500 may introduce additional fault current 606, 608 to the current signals 600, 602. Relative to normal system current and noise 610, 612 preceding time 604 corresponding to the HIF event 500, fault current 608 measured by IED 414 may be larger relative to system current and noise 612 than fault current 606 measured by IED 412 due to the proximity of IED 414 to the HIF event 500 relative to IED 412. That is, fault current signal-to-load ratios measured by IED 414 may be higher than that measured by IED 412 due to its relative proximity to the HIF event 500 and due to the lower current carried by distribution feeder line 402 at the point monitored by IED 414. For example, the magnitude of fault current 608 measured by IED 414 is larger than the system current and noise 612 relative to the magnitude of fault current content 606 measured by IED 412. Accordingly, IED 414 may more accurately detect the HIF event 500 based on fault current and/or interharmonic content 608 than IED 412. Moreover, there is a relatively high current increase measured by IED 414 than IED 412 following the HIF event 500. In certain embodiments, this may also allow IED 414 to detect the HIF event 500 more quickly than IED 412.

In certain embodiments, relative magnitudes of instantaneous fault current 606, 608 and/or signal-to-noise ratios of fault current 606, 608 relative to system noise 610, 612 may be utilized to determine a location of a fault relative to IEDs 412, 414. For example, as illustrated, relative magnitudes of fault current 606, 608 and signal-to-noise ratios of instantaneous fault current 606, 608 relative to system current and noise 610, 612 measured by IED 414 are higher than those measured by IED 412. Accordingly, it may be determined that the location of the electric power delivery system monitored by IED 414 is closer to the HIF event 500 than the location monitored by IED 412. In certain embodiments, fault location information may be stored by IEDs 412, 414 and/or another IED communicatively coupled therebetween.

In certain embodiments, fault location information may be utilized in coordinating one or more protective actions implemented by IEDs 412, 414 and/or other IEDs to mitigate potentially unsafe conditions and damage to the electric power delivery system. Protective actions may be prioritized based on a location of an IED relative to an HIF event 500. For example, based on a determination that IED 414 is located nearer to HIF event 500 than IED 412, IED 414 may implement a protective action to mitigate unsafe conditions caused by the HIF event 500. In certain embodiments, the protective action may include tripping a breaker 416, thereby disconnecting the HIF 500 from the electric power delivery system. If such a prioritized protective action effectively resolves the HIF 500 (i.e., if IED 412 no longer detects an HIF after the protective action), additional protective actions may not need be implemented. If, however, the HIF condition is not resolved, additional protective actions may be implemented and/or other IEDs (e.g., IED 412 may trip breaker 410). Moreover, coordination of such protective actions may also provide additional redundancy, such that if one proactive action fails to resolve the HIF 500, additional protective actions may be implemented until the HIF 500 is resolved.

Figure 7:
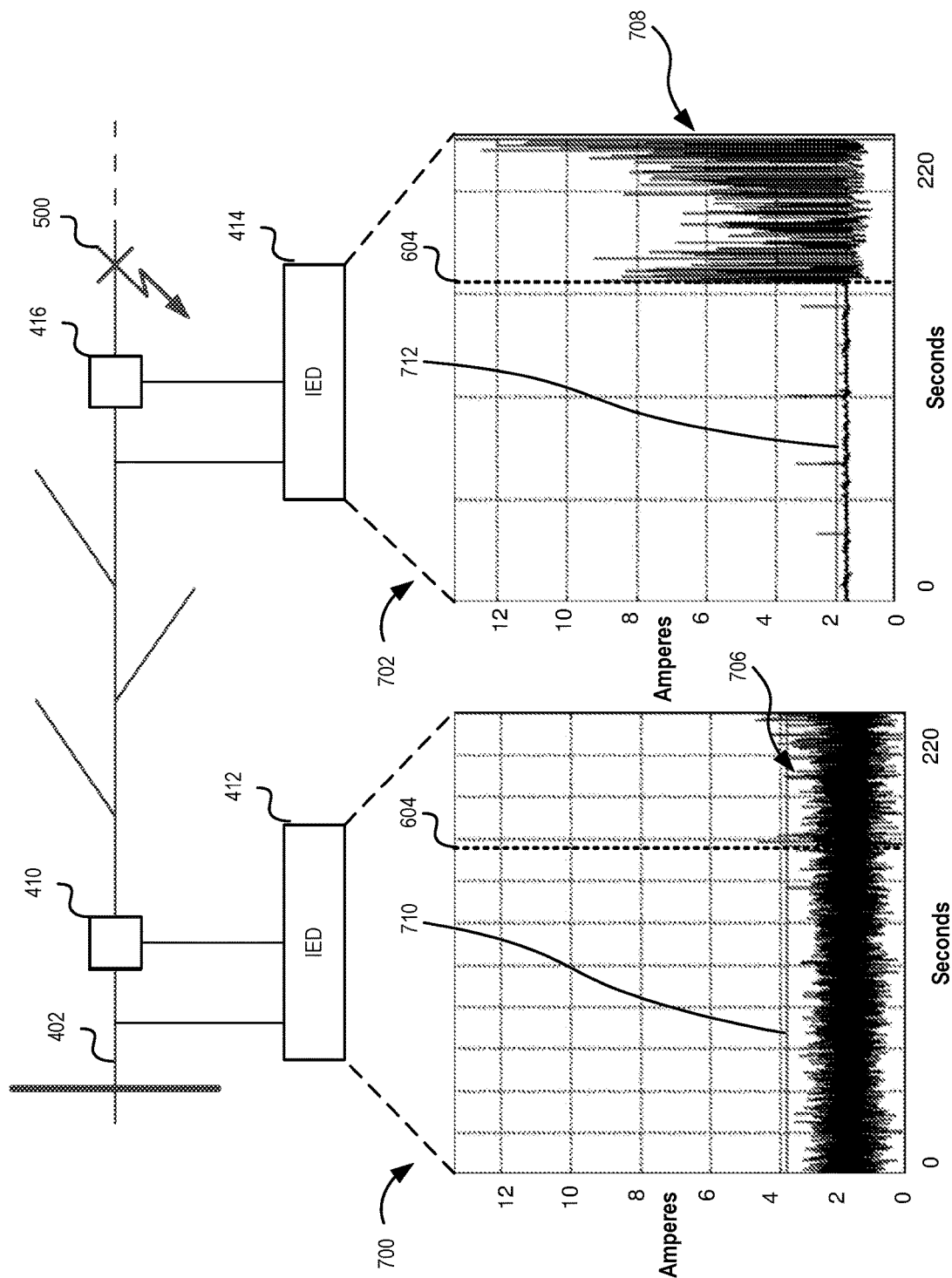
FIG. 7 illustrates exemplary interharmonic current signals associated with a high-impedance fault at two points in an electric power delivery system consistent with embodiments disclosed herein.

FIG. 7 illustrates signals 700, 702 associated with an HIF event 500 and an associated simplified one-line diagram of an electric power delivery system consistent with embodiments disclosed herein. Signal 700 may represent a difference between an interharmonic current and an interharmonic current reference over time measured by IED 412 and signal 702 may represent a difference between an interharmonic current and an interharmonic current reference current over time, as measured by IED 414. At time 604, an HIF 500 may occur on the distribution feeder line 402. The HIF 500 may introduce interharmonic content associated with the fault into current signals along the line 402. Accordingly, signals 700, 702 may include increased interharmonic content 706, 708 following the HIF event 500 due to interharmonic content introduced by the fault that is larger than average interharmonic content associated with system noise.

In certain embodiments, a number of times the signals 700, 702 exceed one or more thresholds 710, 712 may be counted. In addition, a magnitude of the signals 700, 702 when the signals 700, 702 cross the thresholds 710, 712 may be recorded. This information may be utilized, at least in part, in detecting the occurrence of an HIF event 500, determining a relative location of the event 500, and/or in implementing one or more protective actions in connection with the same. As illustrated, because IED 414 is located nearer to the HIF event 500, the magnitude of the interharmonic content 708 may be relatively larger than interharmonic content 706. Accordingly, IED 414 may more accurately and/or quickly detect the HIF event 500 than IED 412 and may implement one or more initial coordinated protective actions in response.

In some embodiments, thresholds 710, 712 utilized to detect and/or identify HIF event 500 may be adaptively tuned to account for normal system noise levels, thereby increasing the accuracy of HIF event detection and/or identification. For example, in some embodiments IEDs 412, 414 may maintain a dynamic reference over time of interharmonic signals included in measured current signals. This long term reference may be utilized as a threshold for differentiating interharmonic signals attributed to normal system noise from interharmonic signals 706, 708 associated with HIF events (e.g., HIF event 500).

Figure 8:
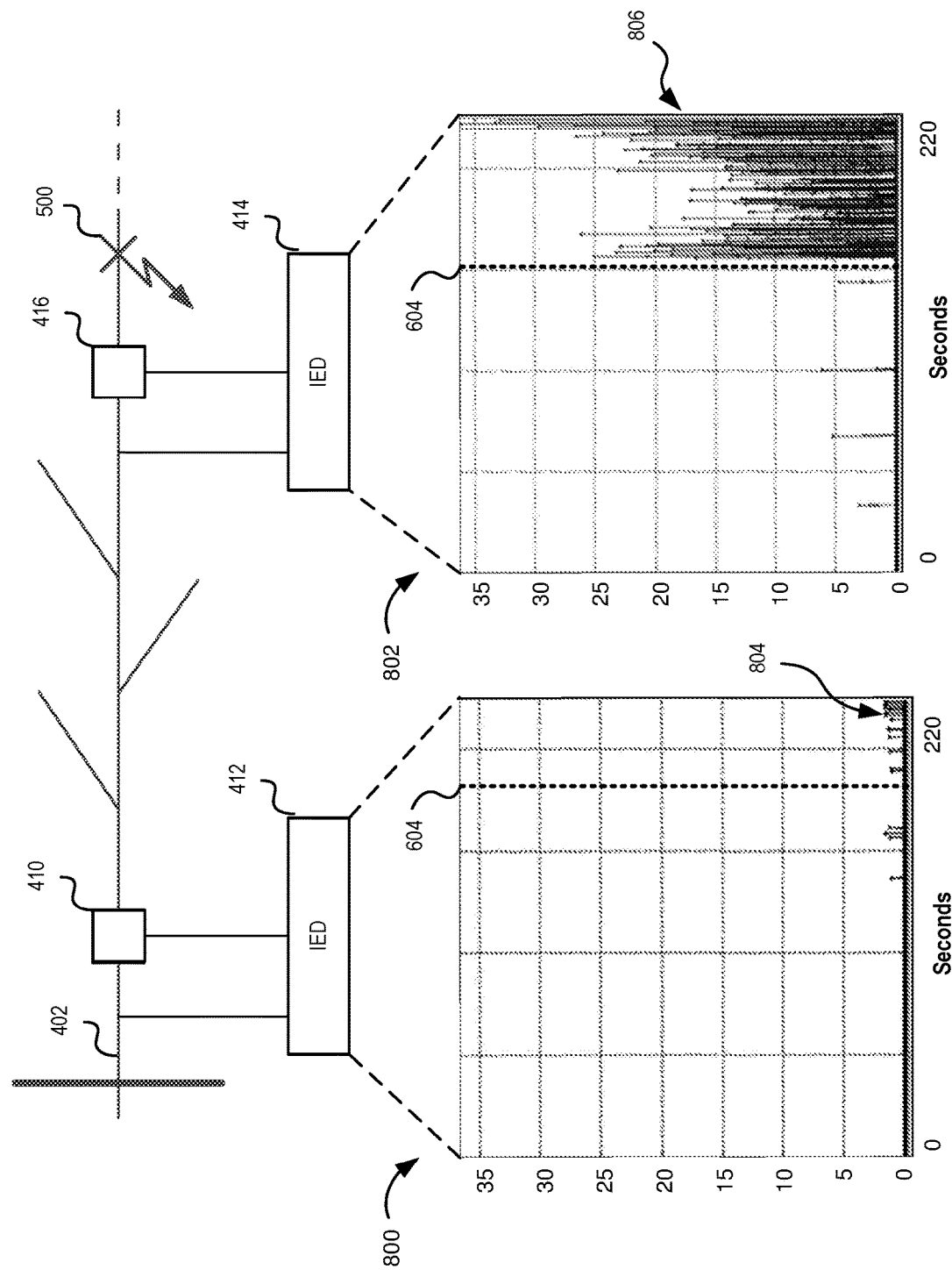
FIG. 8 illustrates an exemplary interharmonic ratio signal associated with a high-impedance fault at two points in an electric power delivery system consistent with embodiments disclosed herein.

FIG. 8 illustrates exemplary interharmonic measurement signals 800, 802 associated with an HIF 500 and an associated simplified one-line diagram of an electric power delivery system consistent with embodiments disclosed herein. Particularly, signal 800 indicates a number of times and associated ratio magnitudes 804 of interharmonic content measured by IED 412 crossing a detection threshold. Similarly, signal 802 indicates a number of times and associated ratio magnitudes of interharmonic content 806 measured by IED 414 crossing a detection threshold.

Signal 800 may represent a difference between an instantaneous measured interharmonic current and an interharmonic current reference over time measured by IED 412 and signal 802 may represent a difference between an instantaneous measured interharmonic current and an interharmonic current reference over time measured by IED 414. At time 604, an HIF 500 may occur on the distribution feeder line 402. The HIF 500 may introduce interharmonic content associated with the fault into current signals along the line 402. Accordingly, signals 800, 802 may include increased interharmonic content 804, 806 following the HIF event 500 due to measured instantaneous interharmonic content introduced by the fault that is larger than the reference interharmonic current associated with system noise. As illustrated, because IED 414 is located nearer to the HIF event 500, the number of times and ratio magnitudes of interharmonic content 806 crossing a detection threshold may both be larger than the same measurements made by IED 412. Accordingly, IED 414 may detect the HIF event 500 more accurately and/or quickly than IED 412 and may implement one or more initial coordinated protective actions in response.

In one embodiment, fault location and detection may be enhanced with additional information regarding the electric power delivery system. For example, the HIF detection algorithms used by IEDs may require an unacceptable amount of time to accurately detect the fault, coordinate, and implement a protective action. Particularly in instances where the fault occurs at distances from the IEDs such that the current to noise ratio of the signals detected by the IEDs are too high to accurately detect and locate a fault, or are sufficiently high to delay the detection of the fault and subsequent protective action. In such instances, additional information from the electric power delivery system may be useful to detect the particular feeder or branch on which the fault has taken place. According to several embodiments, the IEDs may be in communication with conductor-mounted devices configured to provide a signal to the IED regarding the status of the monitored conductor. IEDs may then use the information in the fault location calculation and in the determination as to whether to take a protective action.

Figure 9A:
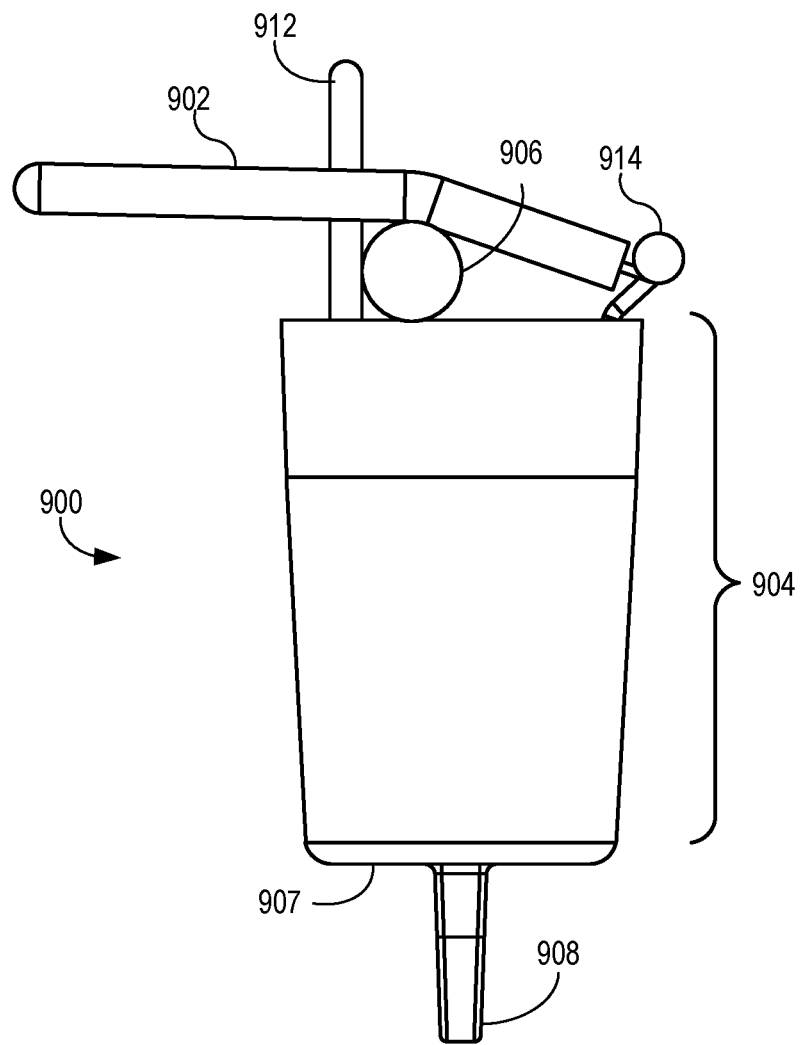
FIG. 9A illustrates a view of a conductor-mounted monitoring device, according to one embodiment.

FIG. 9A illustrates a side view of a conductor-mounted device (CMD) 900. The CMD may include a housing 904 and a protruding eye 908. The protruding eye 908 facilitates the use of a hot stick during installation to or removal from a conductor 906. The housing 904 houses various circuitry and other modules of the CMD 900, as described herein. In various embodiments, a current transformer is housed within the housing 904. The illustrated current transformer includes a pole piece 912 that extends through the housing 904.

In the illustrated, embodiment, the pole piece 912 of the current transformer extends perpendicular to the rear face of the housing 904. In other embodiments, the pole piece 912 may be positioned at an angle relative to the rear face of the housing or in an orientation that is generally perpendicular to the rear face of the housing 904. The exterior portion (i.e., the portion extending from the housing 904, of the pole piece 912 may be coated with an insulating material or may have an insulating sleeve disposed thereon. A clamp assembly 902 attaches the CMD 900 to the monitored conductor such as a cable 906, and holds the cable 906 in proximity to or proximate the pole piece 912 of the current transformer.

The clamp assembly 902 is designed to accommodate for a range of conductors 906 having different diameters. In some embodiments, the conductor 906 may be insulated and in other embodiments the conductor 906 may be uninsulated. The portions of the CMD 900 the touch the conductor may be insulated and/or constructed from a dielectric material to prevent any direct electrical conductions. The size of the CMD 900 relative to the conductor 906 is exaggerated in the figures for clarity. The dimension of the various components of the CMD may be varied based on the conductor size, insulation, rated voltage, and/or anticipated current values.

When installed on a typical overhead conductor, the CMD 900 hangs such that the pole piece 912 is directed generally upward. In some embodiments, the CMD 900 may include one or more balancing weights to attain a specific hanging orientation. In some embodiments, the weights may be adjustable by an installation technician to attain a target orientation of the CMD 900 device.

The illustrated clamp assembly 902 may include one or more arms that act in concert with the pivot member 914 to selectively secure the CMD 900 to the cable 906. A wide variety of clamp assemblies 902 and pivot members 914 may be utilized and the illustrated embodiment is in no way limiting. For example, the claim assembly 902 may be shorter, longer, straighter, include gripping surfaces (such as teeth or high friction surfaces), be curved or even flexibly wrapped around the cable 906.

Figure 9B:
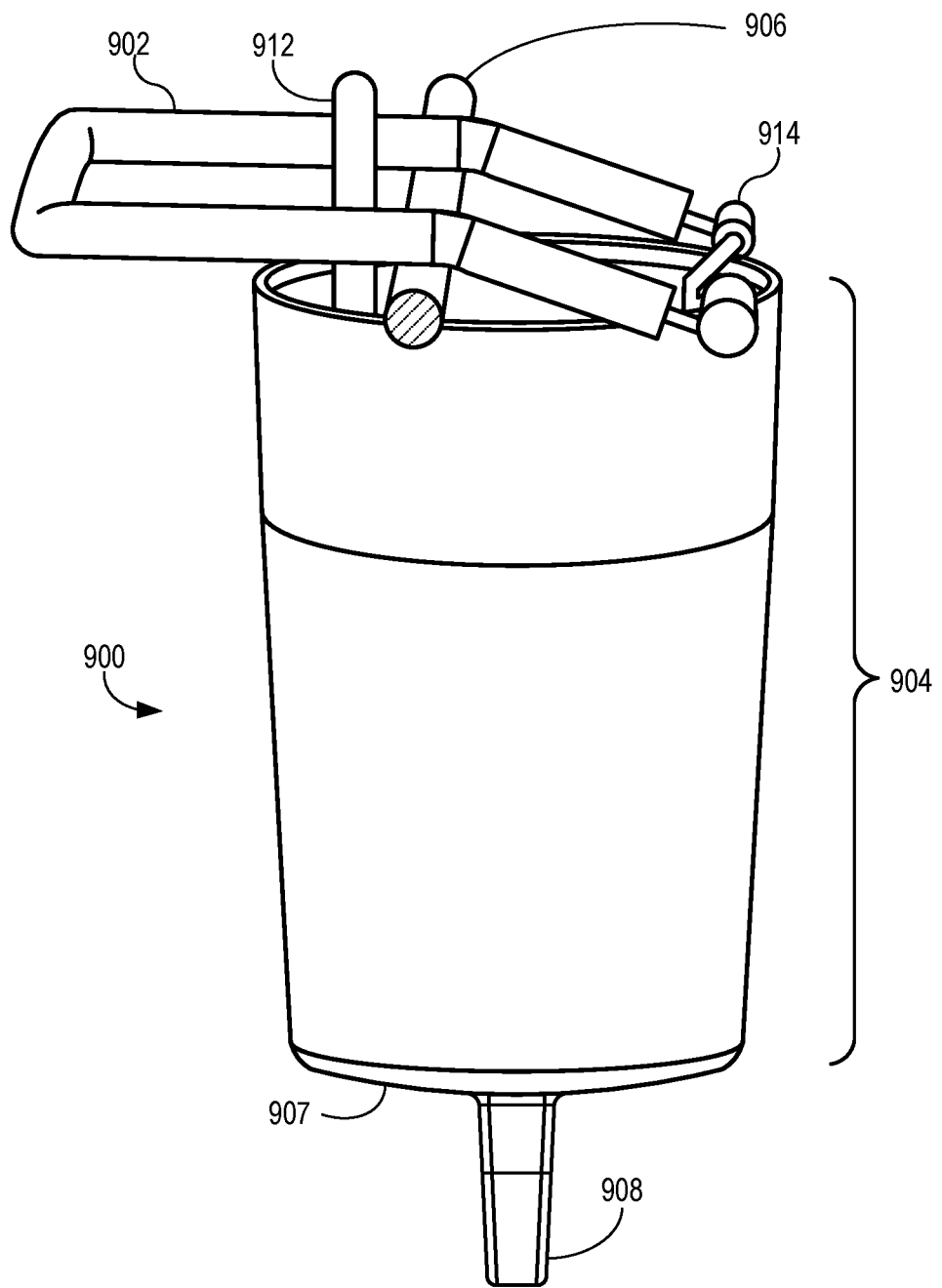
FIG. 9B illustrates a perspective view of the conductor-mounted monitoring device, according to one embodiment.

FIG. 9B illustrates a perspective view of the CMD 900 device, according to one embodiment. As illustrated, clamp assemblies 902 may pivot about pivot member 914 to clamp the CMD 900 to a cable 906. The pole piece 912 of the current transformer may extend through the middle of the clamp assemblies 902. In other embodiments, the claim assemblies may be formed as a single arm on one side of the pole piece 912 of the current transformer.

Figure 9C:
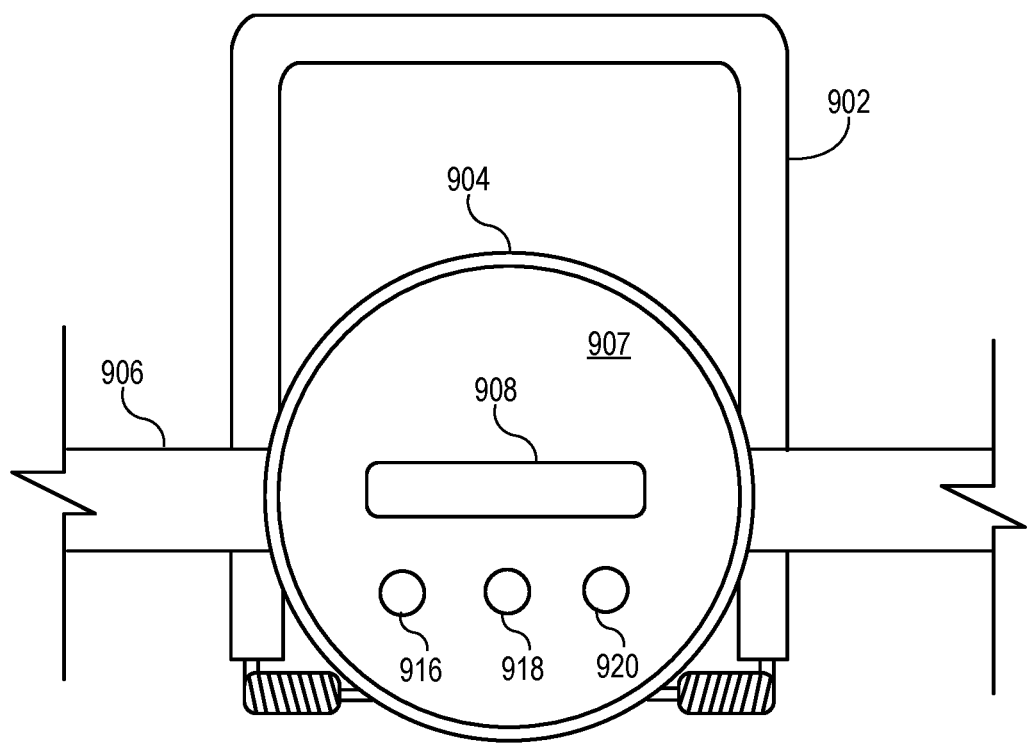
FIG. 9C illustrates another view of the conductor-mounted monitoring device, according to one embodiment.

FIG. 9C illustrates a bottom view of the CMD 900 device, including the face 907 of the CMD 900, according to one embodiment. In various embodiments, the face 907 of the CMD 900 device may be oriented in a downward direction when the CMD 900 is installed on a typical overhead conductor (e.g., as shown in FIGS. 9A-9C). The face 907 may include a plurality of transmitters such as, for example, a fiber-optic port 916 (such as an ST connector), a radio antenna 918, and an LED 920. The transmitters 918-920 may be configured for two-direction and/or one-directional communication using light (e.g. infrared over fiber optics or a laser), radio, and/or visual light (using the LED). Thus, the transmitters 918-920 may include corresponding receivers and/or be configured as transceivers.

In some embodiments, the transmitters, receivers, and/or transceivers may be adapted for high-speed communication. The CMD 900 may communicate with an IED Using one or more of these one- or two-directional communication channels, including one or more of transmitters 918-920) and one or more communication protocols. Various combinations of LEDs, lights, LCD displays, and/or other display elements may provide a visual human machine interface for an operator to confirm an operational state of the CMD 900.

Many of the embodiments herein describe or relate to a CMD that measures current and/or voltage of the conductor. In other embodiments, a CMD may be configured to measure other characteristics of the conductor (e.g., a power line). For example, a CMD may measure a temperate of the conductor, a wind speed proximate the conductor, acceleration of the conductor (e.g., swing or sway), acoustic characteristics (e.g., a fallen or disconnected conductor may have a different acoustic response), conductor sag, and/or the like.

Figure 10:
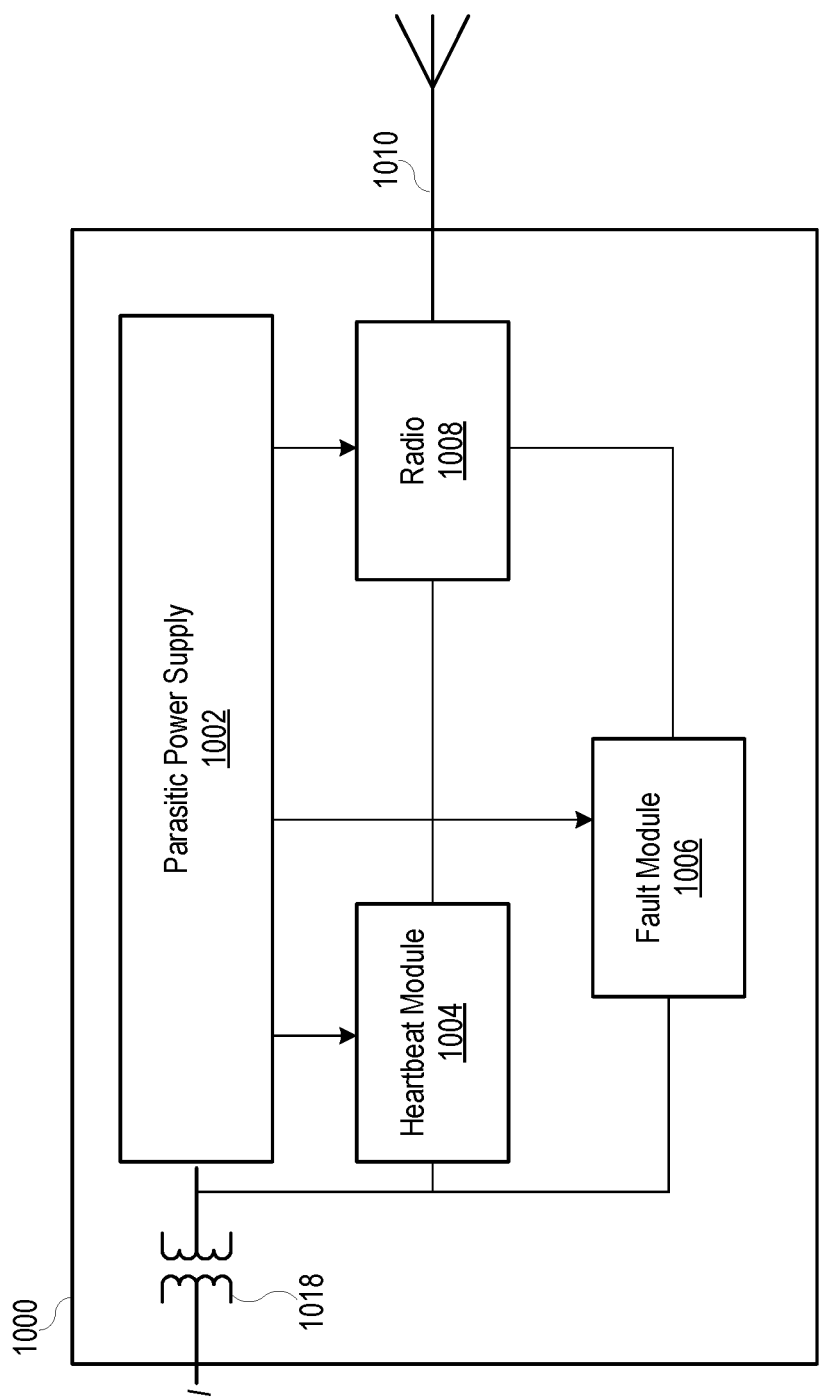
FIG. 10 illustrates a functional block diagram of an embodiment of a conductor-mounted monitoring device for providing a signal to an intelligent electronic device.

FIG. 10 illustrates a simplified functional block diagram of one embodiment of a CMD 1000 that may be used herein. The CMD 1000 may include the components necessary to provide multiple signals to an IED in communication therewith. A heartbeat module 1004 to generate a "heartbeat" signal, such as an operational, function, or online signal to indicate that the CMD 1000 is functional and has power, is at least partially functional, and/or has power. A fault module 1006 may generate a signal indicating a fault on a connected conductor that provides the current signal, I.

Heartbeat module 1004 and fault module 1006 may be implemented using hardware and/or software. For example, heartbeat module 1004 and fault module 1006 may include circuit components, such as resistors, transistors, inductors, capacitors, operational amplifiers and other components.

The CMD 1000, according to the illustrated embodiment, receives a current signal I such as a current signal provided by a pole piece 912 (as seen in FIG. 9A). In various embodiments, the signal provided may be further stepped down using, for example, a transformer 1018. The parasitic power supply 1002 may receive the signal from the electric power conductor, derive power therefrom, condition the power derived therefrom, and/or provide electrical power within predetermined specifications to the other various modules of the CMD 1000.

In various embodiments, the current signal I is a relatively small current compared to the cable from which it is derived. For example, the current signal I may be electromagnetically induced by a current flow in the monitored cable. Thus, the parasitic power supply 1002 may receive an alternating current signal, and include the necessary components to convert the power derived therefrom to a direct current. The parasitic power supply may include a batter, capacitor, or a super-capacitor capable of storing power for use when power is not parasitically available from the conductor.

A heartbeat module 1004 may receive the signal from the transformer 1018 and monitor it to determine if the current I is within operating parameters. The heartbeat module 1004 may communicate with a radio 1008 to activate and send a signal to an IED (via antenna 1010) when the CMD 1000 is functional and/or when the current on the conductor is within operating parameters. Alternatively, the heartbeat module 1004 may communicate with a radio 1008 to activate and send a signal to an IED (via antenna 1010) when the CMD 1000 is non-functional and/or when the current on the conductor is outside of operating parameters.

In many embodiments, the heartbeat module 1004 may perform its monitoring functions using power supplied by the parasitic power supply 1002. Alternatively, the heartbeat module 1004 may default to perform its monitoring functions using power directly from the transformer 1018 unless parasitic power supply 1002 indicates that the heartbeat module 1004 should use power from the parasitic power supply instead and/or the parasitic power supply begins supplying power to the heartbeat module 1004.

In some embodiments, the CMD may default to identifying a LOC state if the various components stop receiving power from the conductor (optionally via the power supply). In such embodiments, the power store may only provide power to the transmitter. Thus, if power is lost on the conductor, various portions of the CMD may cease to be powered and the power stored may be used to send a default LOC signal until the power store is depleted.

The heartbeat module 1004 may include a timer and/or receive a timing signal from an external source. The heartbeat module 1004 may initiate the radio 1008 and assert the heartbeat signal at multiples of a lapse of the timer. In one embodiment, the heartbeat module 1004 may be configured to initiate the radio 1008 and assert the heartbeat signal once per day. In another embodiment, the heartbeat module 1004 may be configured to initiate the radio 1008 and assert the heartbeat signal once every 10 minutes. Other timing schemes are contemplated. The heartbeat module 1004 may be configurable to initiate the radio and assert the heartbeat signal according to any schedule. The schedule may be limited by the amount of power available from the parasitic power supply, and the amount of power required by the heartbeat module and the radio.

A state determination circuit may be configured to determine a state of the conductor based on the current and/or or one or more sensor measurements monitoring one or more characteristics of the conductor. In various embodiments, the fault module 1006 may include a processor or microcontroller. In other embodiments, the fault module 1006 may be implemented in hardware (such as, for example, as an integrated circuit, an application-specific integrated circuit, or the like). The fault module 1006 may include memory for storing data.

In many embodiments, the fault module 1006 may perform its monitoring functions using power supplied by the parasitic power supply 1002. Alternatively, the fault module 1006 may default to perform its monitoring functions using power directly from the transformer 1018 unless parasitic power supply 1002 indicates that the fault module 1006 should use power from the parasitic power supply instead and/or the parasitic power supply begins supplying power to the heartbeat module 1004.

In one embodiment, the fault module 1006 may include a comparator for comparing an element or characteristic of the signal from the transformer 1018 with a predetermined threshold. For example, the comparator may compare a voltage derived from the signal from the transformer 1018 with a predetermined voltage threshold. If the derived voltage falls below the voltage threshold, then the fault module 1006 may determine a fault. When the fault module 1006 determines a fault, the fault module 1006 may initiate the radio 1008 to transmit a fault signal to the IED.

In one embodiment, when the derived voltage is too low, the parasitic power supply 1002 may be unable to obtain power from the conductor. The parasitic power supply 1002 may include a capacitor for storing power for the instance when power to the transformer 1018 is lost, such that the fault module 1006 and the radio 1008 may have access to sufficient power to transmit a fault signal to the IED. In some embodiments, the parasitic power supply reserves an amount of power necessary for transmitting the fault signal to the IED, even if such reservation limits the ability of the heartbeat module 1004 to send periodic heartbeat signals to the IED.

Thus, the CMD 1000 may be configured to periodically transmit a heartbeat signal to an IED, and upon a determination that the monitored conductor has lost power, experienced an overvoltage, experienced an undervoltage, experienced an irregularity, or experienced another deviation from a threshold value, may transmit a fault signal to the IED.

In certain embodiments, the CMD 1000 may be configured as a faulted circuit indicator in that it includes further components such as a microprocessor capable of detecting a fault condition on the monitored conductor, including HIFs and fault conditions that don't result in a complete loss of power, undervoltage, or overvoltage.

In other embodiments, the CMD 1000 may be configured different than as depicted and instead or additionally be configured to measure other characteristics of the conductor. For example, the CMD 1000 may measure a temperate of the conductor, a wind speed proximate the conductor, acceleration of the conductor (e.g., swing or sway), acoustic characteristics (e.g., a fallen or disconnected conductor may have a different acoustic response), conductor sag, and/or the like. In such embodiments, the fault module 1006 may be reconfigured as state determination circuit to determine a state of the conductor as abnormal or normal based on sensor date collected by a sensor system monitoring the characteristic of the conductor, as described above.

Figure 11:
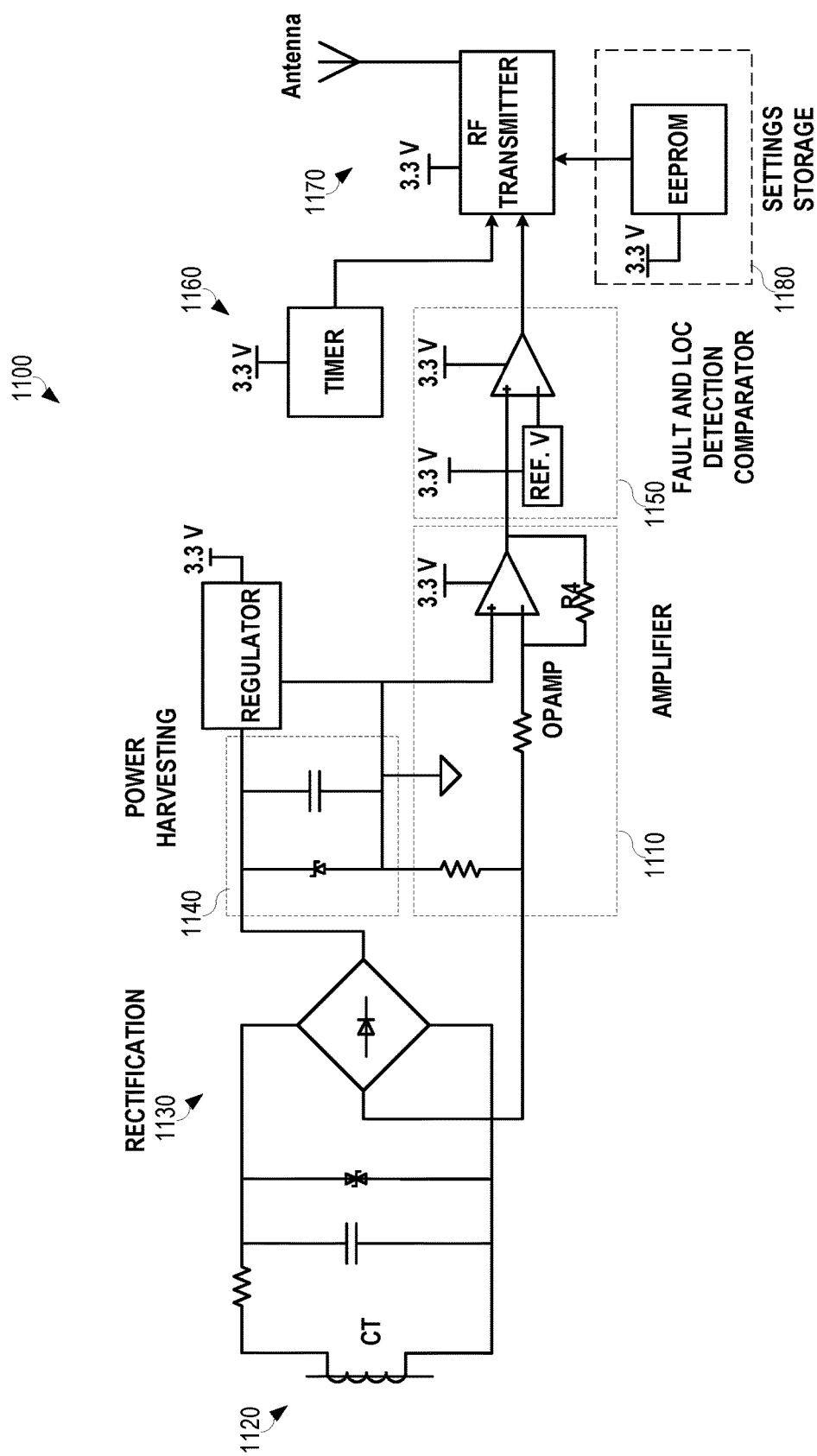
FIG. 11 illustrates a logical diagram of an embodiment of a conductor-mounted monitoring device for producing a signal to an intelligent electronic device.

FIG. 11 illustrates a logical diagram 1100 of a CMD, according to various embodiments described herein. The diagram 1100 illustrates a CMD for detecting HIFs with at least one of: 1) Providing periodic "heartbeat" signals to a receiver connected to a remote IED monitoring for faults; and 2) Detecting Loss of load Current (LOC") and providing an LOC signal to a receiver connected to a remote IED monitoring for faults.

The CMD may communicate heartbeat signals to a different IED and/or receiver of an IED than the IED or receiver of an IED that receives the LOC signal. For instance, a CMD may utilize a relatively low power communication system to communicate periodic heartbeat signals. Given the relatively lower importance of the heartbeat signal, the heartbeat communication system (e.g., transmitter) may be less reliable, not include receipt confirmation, not include encryption, etc. Simplifying the heartbeat signal may reduce the continuous or periodic power consumption of the CMD. In contrast, the CMD may utilize a relatively higher power (potentially still "low-power") communication system to communicate a fault condition. The relative importance and less frequent transmission of a fault transmission may justify a more complex, higher power transmission.

The circuit illustrated in FIG. 11 includes components for detecting Loss Of load Current (LOC) on the power line (connected via CT 1120) using an amplifier circuit stage 1110 and a comparator circuit stage 1150 or fault detection circuit. The CMD harvests power via a power harvesting circuit stage 1140 from the current flowing through the overhead power line. The power harvesting circuit stage 1140 may receive power from the CT 1120 that is rectified via a rectifier circuit stage 1130. The power harvesting circuit stage may include a power store, such as a capacitor or battery.

Thus, the CMD may store energy harvested from the conductor power in capacitors, batteries, super capacitors, and the like to operate one or more of the other components of the CMD. In the illustrated example, the various stages of the CMD are powered with 3.3 Volt power by the power store (capacitor) in the power harvesting circuit stage 1140.

The CMD may be continually monitoring for a LOC via the comparator circuit stage 1150. The comparator stage 1150 may determine a conductor state as (i) a normal (or powered), (ii) in a fault state, or (iii) in a LOC state. In some embodiments, the comparator stage 1150 may determine a conductor state as either (i) a powered state or a (ii) a LOC state, or alternatively as either (i) a powered state or a (ii) a fault state. A LOC may indicate or be an indicator of a fault. Accordingly, the CMD may utilize the RF transmitter 1170 and associated antenna to communicate a LOC signal to an IED. A settings component 1180 may include storage and control components to control the RF transmitter. For example, the settings component 1180 may be used to specify communication channels, protocols, timings, and the like. The comparator stage 1150 may implemented in alternative approaches using any of a wide variety of circuit components, sensors, and measurement devices to function as a fault detector.

In some embodiments, the CMD may communicate a heartbeat signal on a periodic basis to the same or a different IED. A timer 1160 may be used to periodically cause the RF transmitter 1170 to transmit a "heartbeat" or other signal indicating that the CMD is continuing to monitor the power line via the CT 1120.

The settings component 1180 may be used to specify the frequency with which the timer will cause the heartbeat signal to be transmitted. In some embodiments, the CMD may include a receiver and the heartbeat signal may only be sent upon reception of a request signal by the CMD.

The circuit shown in FIG. 11 uses an operational amplifier (OP-AMP), a voltage reference. and a comparator to detect loss of load current in few milliseconds. In other embodiments, similar functionality can be attained using a combination of alternative circuit components. For example, a combination of resistors, capacitors, transistors, and/or inductors may be utilized in place of integrated components such as OP-AMPs and comparators.

The comparator circuit trigger may trigger the RF transmitter to send a message indicating loss of load current to a remote receiver (e.g., of an IED or more simple repeater). The remote receiver may decode and send this message to the connected protective relay (e.g., a different IED or more complex protective IED). The protective relay utilizes this information for verification along with its own HIF detection ("Hi_Z") algorithms to detect downed conductor faults.

In some embodiments, the amplifier circuit stage 1110 and the comparator circuit stage 1150 may be used to detect a fault and, if the fault is cleared, subsequently to detect a LOC. The RF transmitter 1170 may transmit each type of event using different signals. Thus, a receiving IED can distinguish between Line to Line faults that create large fault currents and, once cleared, result in LOC, and downed line events in which no surge in current is experienced (just a LOC event).

That is, in the case of short circuit faults, the CMD sends a fault message followed by a LOC message (due to protective relays clearing the fault). For a downed conductor fault, the CMD only sends a LOC message to the IED via the RF transmitter 1170.

As previously described, the CMD may periodically send a 'heart beat' signal indicating that the CMD is powered and alive. If this signal does not arrive at the receiver of an IED at a pre-defined interval, one possible cause may be a loss of load current on the overhead line when the IED (protective relay) connected to the fast fault receiver has detected a HIF, but is waiting for a timer to expire before tripping the line.

Figure 12:
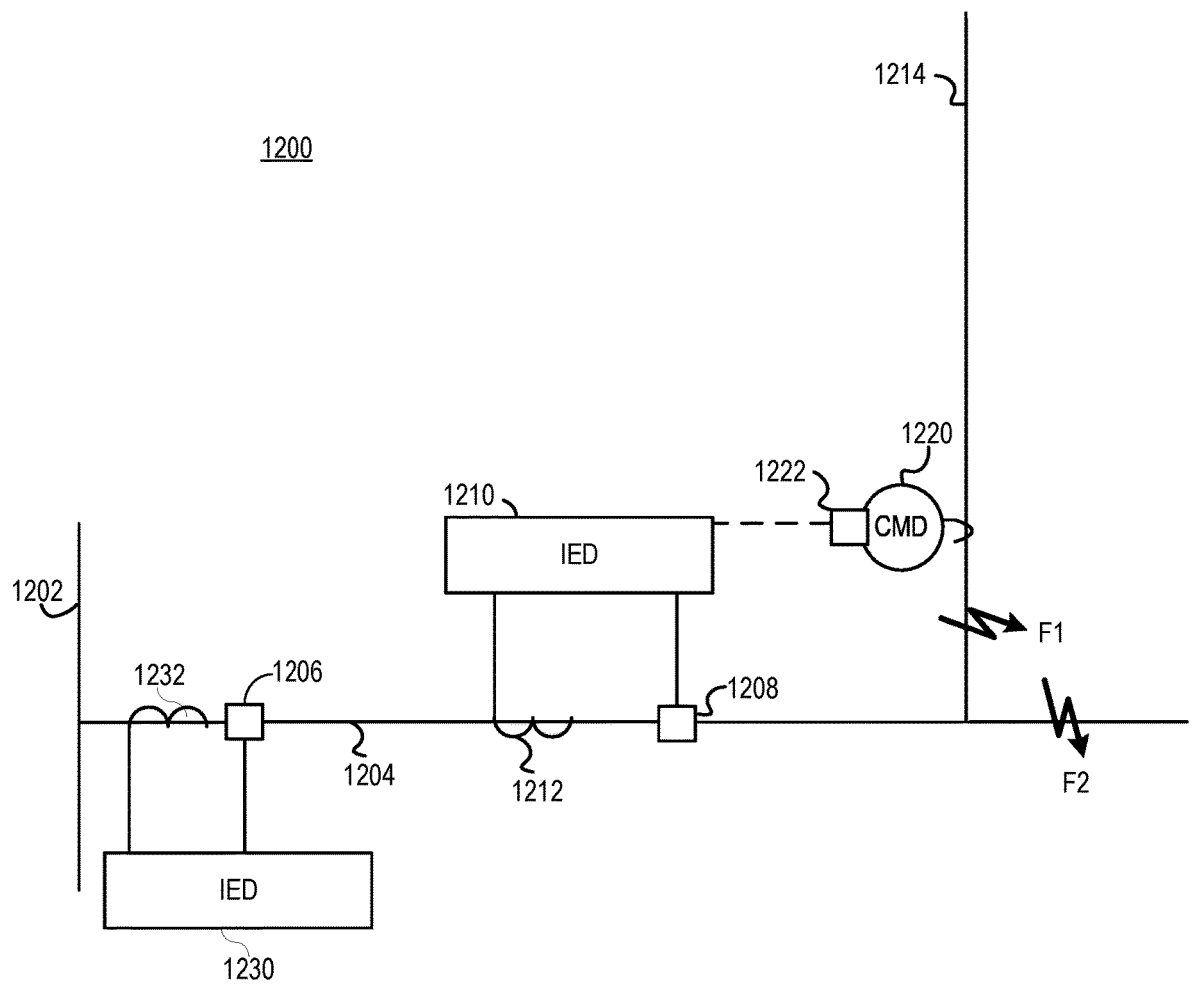
FIG. 12 illustrates a one-line diagram of an embodiment of a system for coordinated detection of high-impedance faults in an electric power delivery system.

FIG. 12 illustrates a simplified one-line diagram of a system 1200 configured to coordinate protection of an electric power delivery system during a HIF. The electric power delivery system may include a bus 1202, feeder 1204, branch 1214, and may include further buses, feeders, and branches (such as branch 1214). Feeder 1204 is monitored using an IED 1230, which may obtain electric power system signals using CTs (such as CT 1232), PTs, and the like. IED 1230 may be in communication with a circuit breaker 1206, and may be configured to signal the circuit breaker 1206 to open if an event is detected.

Downstream of IED 1230, a second IED 1210 may be configured to monitor a portion of the electric power system. IED 1230 may obtain electric power system signals from feeder 1204 using, for example, CTs (such as CT 1212), PTs, and the like. IED 1210 may be in communication with a circuit breaker 1208, and be configured to signal the circuit breaker 1208 to open upon detection of an event. As described above, upon occurrence of a HIF, the IED closest to the fault should obtain a better signal for operation, and open its related circuit breaker first to clear the fault. In some instances, however, such as when the fault happens on the branch 1214 from the feeder 1204, the signal obtained by the IED 1210 may be insufficient to declare a fault condition, and/or the time required to reliably detect the HIF condition may be unacceptably long. A CMD 1220 (according to any combination of the various embodiments described herein) may obtain signals from branch 1214 and signal IED 1210 using a communication module 1222 (such as a radio) upon detection of a fault and/or LOC.

According to the above embodiment, when branch 1214 experiences a broken-conductor followed by a HIF at fault location F1, the CMD 1220 may detect a drop in voltage and signal the IED 1210. IED 1210 can use this signal to determine its protection function. For example, IED 1210 may receive the signal and open circuit breaker 1208. IED 1210 may use the signal from CMD 1220 along with its HIF detection results, and (in some embodiments) HIF detection communications from IED 1230 to determine whether breaker 1208 should be opened.

Conversely, when a fault occurs at fault location F2, CMD 1220 may not detect a loss of current or voltage, and thus will not signal IED 1210. IED 1210 may then rely on its fault detection modules to determine whether to open breaker 1208. Additional CMDs may be used on feeder 1204 and other branches to communicate with IED 1210 and/or IED 1230. The combination of all the available information may be used to make improved, faster, more accurate, and/or more selective protection decisions.

Figure 13:
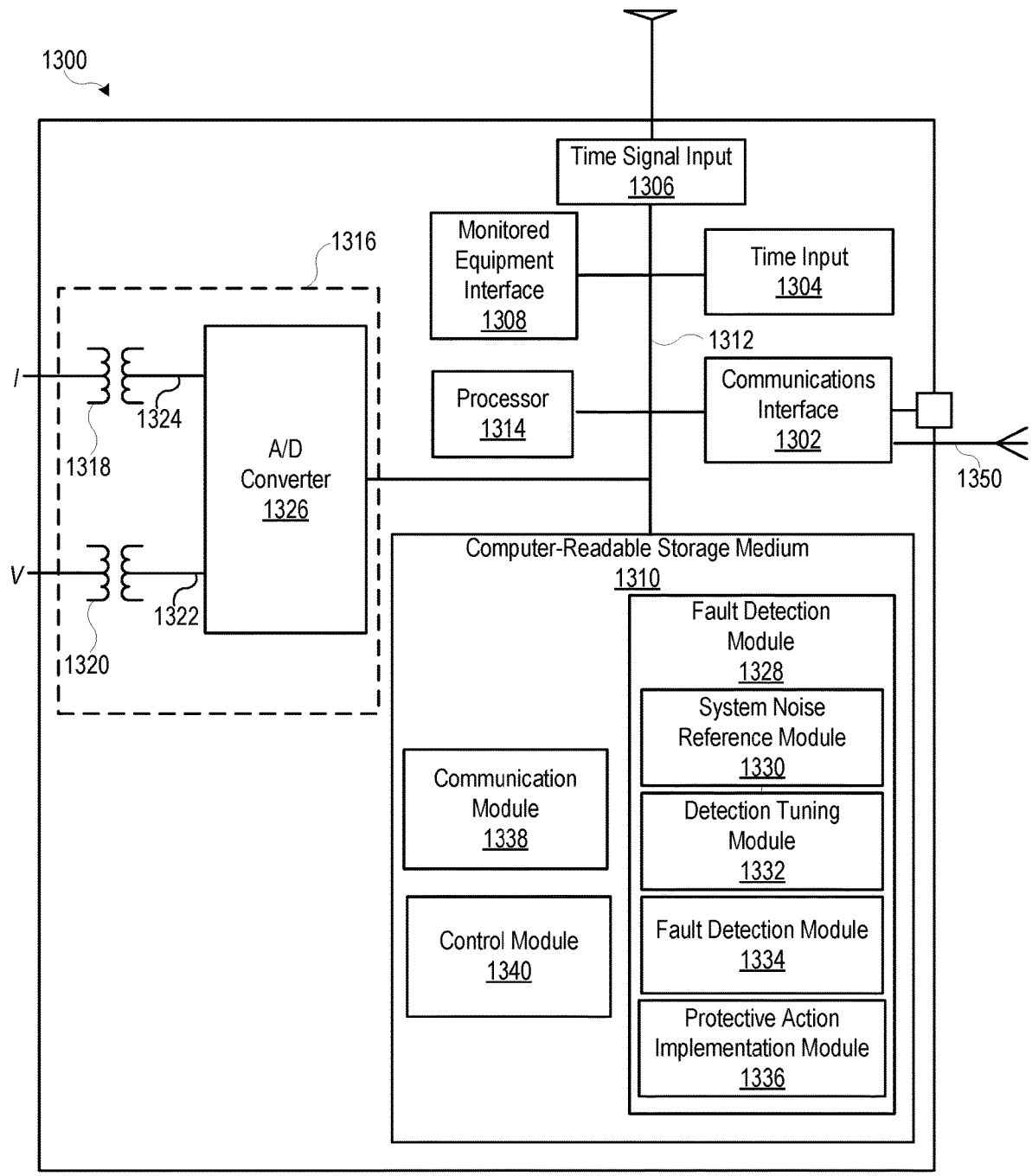
FIG. 13 illustrates a functional block diagram an embodiment of an intelligent electronic device consistent with embodiments disclosed herein.

FIG. 13 illustrates a block diagram of an IED 1300, according to various embodiments disclosed herein. Embodiments of the IED 1300 may be utilized to implement the systems and methods disclosed herein. For example, the IED 1300 may be configured to detect HIF events and implement one or more suitable protective actions in response to the same. The IED 1300 may also be configured to coordinate its actions and/or the actions one or more other IEDs based, at least in part, on information provided by the other IEDs.

The IED 1300 may include a communications interface 1302 configured to communicate with a communication network. The communications interface 1302 may include a separate communications interface to communicate with one or more CMDs, to receive signals therefrom related to current flowing through conductors on one or more phases or sections of the electric power delivery system. The communications interface 1302 may additionally or alternatively communicate with one or more CMDs to receive signals therefrom related to a temperate of a conductor, a wind speed proximate a conductor, acceleration of a conductor (e.g., swing or sway), acoustic characteristics (e.g., a fallen or disconnected conductor may have a different acoustic response), conductor sag, and/or the like. The CMD may transmit a heartbeat signal to the IED and, if a state of the conductor is determined to be abnormal, the CMD may transmit a signal indicating the abnormal state to the IED. The CMD may be configured such that a threshold value or a threshold rate of change in a value of a monitored characteristic of a conductor indicates an abnormal state. For example, wind speeds above a predetermined level may indicate a fault or potential for a fault, which the IED can use to trip a breaker or feed a load using an alternative source.

The communications interface may include an antenna 1350 for receiving signals from a CMD. The IED 1300 may also include a time input 1304, which may be used to receive a time signal. In certain embodiments, a common time reference may be received via the communications interface 1302. In such embodiments, a separate time input 1304 and/or Global Navigation Satellite System (GNSS) time input 1306 may not be necessary. One such embodiment may employ the IEEE 1588 protocol. Alternatively, a GNSS input 1306 may be provided in addition to, or instead of, the time input 1304.

A monitored equipment interface 1308 may be configured to receive equipment status information from, and issue control instructions to a piece of monitored equipment, such as an electrical generator, breaker, voltage regulator controller, and/or the like. According to various embodiments, the monitored equipment interface 1308 may be configured to interface with a variety of equipment of an electric power delivery system. In certain embodiments, the equipment status information and/or control instructions may be communicated over the network interface 1302.

A computer-readable storage medium 1310 may be the repository of one or more modules and/or executable instructions configured to implement any of the processes described herein. In some embodiments, the computer-readable storage medium 1310 and the modules therein may all be implemented as hardware components, such as via discrete electrical components, via and FPGA, and/or via one or more ASICs.

In the illustrated embodiments, a data bus 1312 may link a monitored equipment interface 1308, the time input 1304, the communications interface 1302, the GNSS time input 1306, and/or the computer-readable storage medium 1310 to a processor 1314.

The processor 1314 may be configured to process communications received via the communications interface 1302, the time input 1304, the GNSS time input 1306, and/or the monitored equipment interface 1308. The processor 1314 may operate using any number of processing rates and architectures. The processor 1314 may be configured to perform various algorithms and calculations described herein using computer executable instructions stored on computer-readable storage medium 1310. Processor 1314 may be embodied as a general purpose integrated circuit, an application specific integrated circuit, a field-programmable gate array, and/or other programmable logic devices.

In certain embodiments, the IED 1300 may include a sensor component 1316. In the illustrated embodiment, the sensor component 1316 is configured to gather data from a location of the electric power delivery system (not shown) using a current transformer 1318 and/or a voltage transformer 1320. The voltage transformer 1320 may be configured to step-down the power system's voltage (V) to a secondary voltage waveform 1322 having a magnitude that can be readily monitored and measured by the IED 1300. Similarly, the current transformer 1318 may be configured to proportionally step-down the power system's line current (I) to a secondary current waveform 1324 having a magnitude that can be readily monitored and measured by the IED 1300. Although not separately illustrated, the voltage and current signals V and I may be secondary signals obtained from equipment instruments designed to obtain signals from power system equipment. For example, a secondary voltage signal V may be obtained from a potential transformer (PT) in electrical communication with a conductor. A secondary current signal I may be obtained from a current transformer (CT) in electrical communication with a conductor. Various other instruments may be used to obtain signals from electric power delivery systems including, for example, Rogowski coils, optical transformers, and the like.

An analog-to-digital converter 1326 may multiplex, sample and/or digitize the measured voltage and/or current signals to form corresponding digitized current and voltage signals. Similar values may also be received from other distributed controllers, station controllers, regional controllers, or centralized controllers. The values may be in a digital format or other format. In certain embodiments, the sensor component 1316 may be utilized to monitor current signals associated with portion of an electric power delivery system and/or detect interharmonic content associate with HIF events included in such monitored current signals. Further, the sensor component 1316 may be configured to monitor a wide range of characteristics associated with monitored equipment, including equipment status, temperature, frequency, pressure, density, infrared absorption, radio-frequency information, partial pressures, viscosity, speed, rotational velocity, mass, switch status, valve status, circuit breaker status, tap status, meter readings, conductor sag and the like.

The A/D converter 1326 may be connected to the processor 1314 by way of the bus 1312, through which digitized representations of current and voltage signals may be transmitted to the processor 1314. As described above, the processor 1314 may be used to apply equipment status, measurements, and derived values to an IED module (e.g., the modules in the computer-readable storage medium 1310). The processor 1314 may be used to detect the occurrence of HIF conditions and issue control instructions in response to the same (e.g., instructions implementing protective actions).

It should be noted that a separate device may be used in place of a sensor component 1316 for providing signals from the electric power delivery system to the IED 1300. Indeed, a separate device may be configured to obtain signals from the electric power delivery system (such as voltage and/or current signals), and create digitized representations of the signals (for example current and voltage signals), apply a time stamp, and/or supply such information to the IED 1300. Further, the separate device may be configured to supply equipment status and/or measurements such as voltage and/or current magnitudes and/or angles along with time stamps to the IED 1300. In certain embodiments, the information that has been described as received from the sensor component 1316 is instead received from the communications interface 1302.

A monitored equipment interface 1308 may be configured to receive status information from, and issue control instructions to a piece of monitored equipment. The monitored equipment interface 1308 may be configured to issue control instructions to one or more pieces of monitored equipment. According to some embodiments, control instructions may also be issued via the communications interface 1302. Control instructions issued via the communications interface 1302 may be transmitted, for example, to other distributed controllers, coordination controllers, IEDs, or the like (not shown), which in turn may issue the control instruction to a piece of monitored equipment. Alternatively, the piece of monitored equipment may receive the control instruction directly via its own communications interface.

The computer-readable storage medium 1310 may be the repository of one or more modules and/or executable instructions configured to implement certain functions and/or methods described herein. For example, the computer-readable storage medium 1310 may include a fault detection module 1328, which may be a repository of the modules and/or executable instructions configured to implement the HIF detection and protection functionalities described herein. The fault detections module 1328 may include, among others, a system noise reference module 1330, a detection tuning module 1332, a fault detection module 1334, and a protective action implementation module 1336. The computer-readable medium 1310 may further include a communication module 1338 and a control module 1340.

The fault detection module 1328 may receive signals obtained using antenna 1350 from CMDs in communication with the IED 1300. As described above, the signals may include a heartbeat signal, a fault detection signal, and/or a LOC signal. The fault detection module 1328 may be configured to expect a heartbeat signal on a predetermined schedule, and alarm when the heartbeat signal is not received as per the schedule.

The fault detection module 1328 may further use a fault detection signal received using antenna 1350 from a CMD in its protection algorithms. The fault detection signal may be used to coordinate operations of the IED 1300. In one embodiment, the fault detection signal may be used to issue a protective command such as opening a circuit breaker. In another embodiment, the fault detection signal may be used in combination with another fault detection signal such as a HIF signal, overcurrent signal, undervoltage signal, balance signal, or the like derived from the electric power system by the IED 1300.

The fault detection module 1334 may be configured to perform certain HIF detection functions described herein. In certain embodiments, the fault detection module 1334 may be configured to identify the occurrence of a HIF based on instantaneous interharmonic content included in a current signal information, that may be provided, for example, by the sensor component 1316. In certain embodiments, the fault detection module 1334 may interface with the system noise reference module 1330, which may store average interharmonic content of a current signal over time. Such information may be used by the fault detection module 1334 in differentiating interharmonic content associated with a HIF from interharmonic content associated with normal system noise.

In further embodiments, the fault detection module 1334 may interface with the detection tuning module 1332 that provides information utilized in tuning fault detection thresholds. In certain embodiments, such thresholds may be dynamically adapted and/or tuned based on interharmonic content included in signals measured by sensor component 1316 over time. The protective action implementation module 1336 may interface with the fault detection module 1334. Upon receiving an indication from the fault detection module 1334 of a detected HIF event, the protective action implementation module 1336 may implement one or more protective actions to mitigate potentially unsafe conditions and damage to an electric power delivery system (e.g., issuing control instructions to trip a breaker and isolate the HIF from the system).

The control module 1340 may be configured for interacting with monitored equipment connected to distributed controller via the monitored equipment interface 1308 and/or via the communications interface 1302. According to some embodiments, control instructions from the control module 1340 may be intended as control instructions for other IEDs and/or monitored equipment located remote to the IED 1300. In some cases, control instructions may be only informative or suggestive, meaning that the receiving IED is not obligated to perform the control instruction. Rather, the receiving IED may use the suggested control instruction in coordination with its own determinations and information from other controllers to determine whether it will perform the control instruction. In other embodiments, control instructions may be directive in that they are required actions. Differentiation between informative or suggestive control instructions and mandatory control instruction may be based on information included with the control instruction.

The communication module 1338 may include instructions for facilitating communication of information from the IED 1300 to other controllers and/or other components in the electric power delivery system. The communication module 1338 may include instructions on the formatting of communications according to a predetermined protocol. The communication module 1338 may be configured with subscribers to certain information, and may format message headers according to such subscription information.

Figure 14:
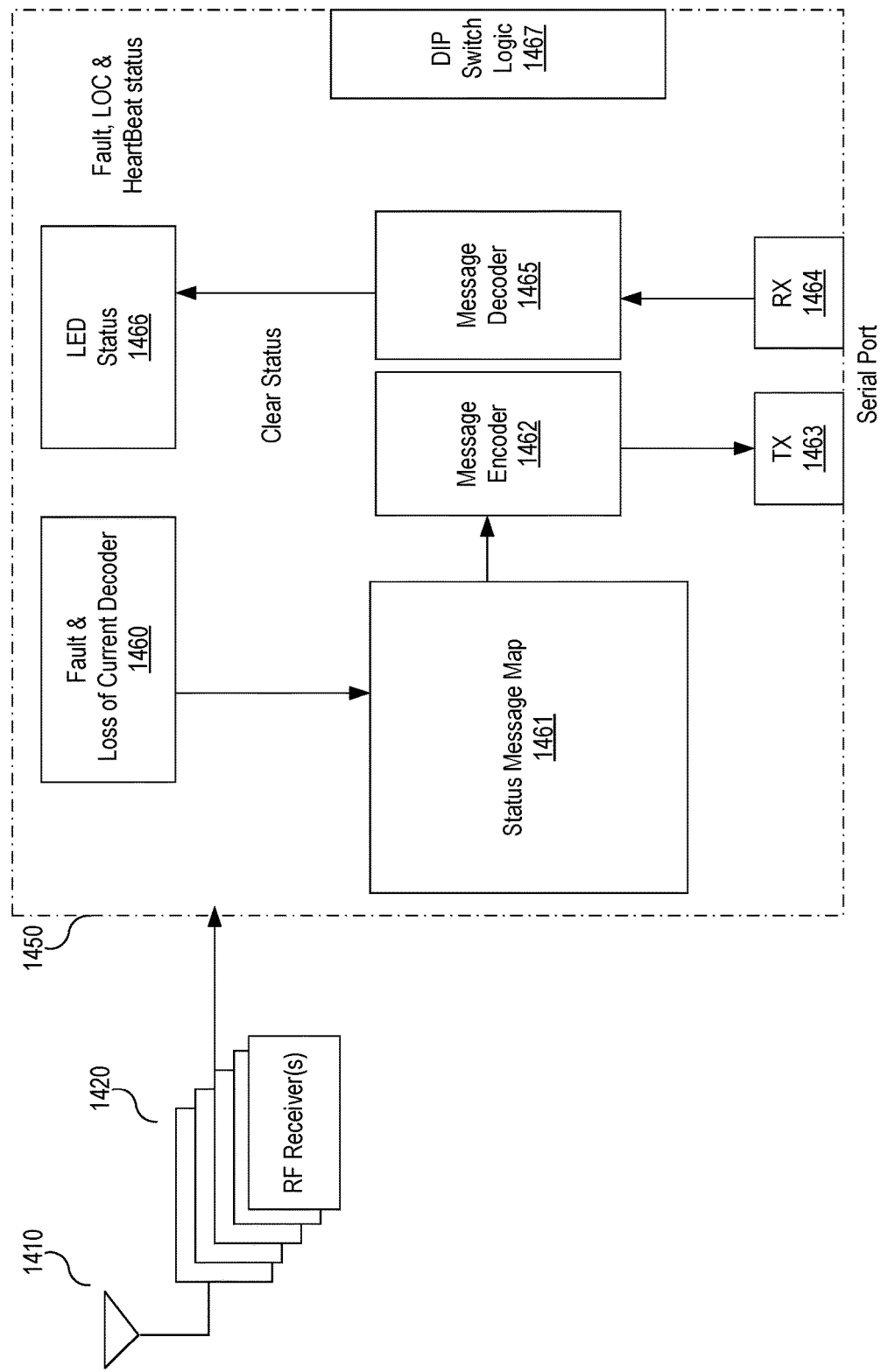
FIG. 14 illustrates a functional block diagram of an embodiment of an intelligent electronic device consistent with embodiments disclosed herein.

FIG. 14 illustrates a block diagram of an IED according to various embodiments herein. An antenna 1410 of the embodiment illustrated in FIG. 14 is in communication with one or more RF receivers 1420 to illustrate that the IED 1450 may be in communication with one or more CMDs. As illustrated, a decoder 1460 may determine if a signal received from a CMD indicates a fault or a LOC. The IED 1450 and/or associated RF receivers 1420 may include logic to detect and correct and communication errors (such as packet loss, signal degradation, and/or signal to noise issues). The results of the decoder 1460 may be communicated to a status message map 1461. The status of the conductor (e.g., fault condition or LOC condition) may result in a transmission of an encoded message to another IED, protective element, and/or control device. A message encoder 1462 may encode the message to be send via a transmitter 1463. A receiver 1464 may receive signals that can be decoded via message decoder 1465. LEDs 1466, a display, and/or other human-machine interface (HMI) may be used to communicate the fault status, LOC status, and/or heartbeat status of a CMD. DIP switch logic 1467 may be used to control the functionality of the IED 1450.

The examples and illustrations provided relate to specific embodiments and implementations of a few of the many possible variations. It is understood that the disclosure is not limited to the precise configurations and components disclosed herein. Accordingly, many changes may be made to the details of the above-described embodiments without departing from the underlying principles of this disclosure. The scope of the present invention should, therefore, be determined in the context of the possible claims that are supportable by this disclosure, including the following:

What is claimed:

1. A conductor mounted device, comprising:
   a clamp assembly to secure the mounting device to a conductor;
   a current transformer coupled to the conductor to produce a secondary current proportional to a primary current in the conductor;
   a heartbeat circuit stage to generate a heartbeat signal indicating that the conductor mounted device is functional;
   a state determination circuit to determine a state of the conductor independent of the heartbeat signal;
   a transmitter to
      wirelessly transmit the heartbeat signal on a periodic basis, and
      wirelessly transmit the conductor state in response to a determined change in the conductor state separate from the wirelessly transmitted heartbeat signal; and
   a power supply to
      receive at least a portion of the secondary current to charge a power store, and
      supply power to at least the transmitter of the conductor mounted device.

2. The device of claim 1, wherein the current transformer comprises a pole piece that extends from the conductor mounted device proximate the conductor.

3. The device of claim 1, wherein the clamp assembly comprises at least one clamping arm that pivots via a pivot member.

4. The device of claim 1, further comprising:
   a human machine interface (HMI) oriented toward the ground when the conductor mounted device is mounted to the conductor, the HMI comprising at least one display element.

5. The device of claim 1, wherein the transmitter comprises a wireless RF transmitter, and wherein the conductor mounted device further comprises an antenna connected to the transmitter.

6. The device of claim 1, wherein the power store comprises one of a capacitor and a battery, and wherein the power supply comprises a rectifier to rectify the secondary current to charge the power store.

7. The device of claim 6, wherein the power supply is further configured to supply power to the heartbeat circuit stage and the state determination circuit.

8. The device of claim 1, further comprising a timing circuit to cause the heartbeat circuit stage to transmit the heartbeat signal on a periodic basis via the transmitter.

9. The device of claim 1, wherein the state determination circuit comprises a comparator circuit stage to receive at least a portion of the secondary current to identify a conductor state as at least one of a loss of load current (LOC) state and a fault state.

10. The device of claim 9, wherein the comparator circuit stage comprises an operational amplifier to compare a voltage derived from the secondary current with a reference voltage from the power supply.

11. The device of claim 1, wherein the state determination circuit comprises:
   a monitoring sensor to monitor a characteristic of the conductor and output sensor data; and
   a comparator circuit stage to receive the sensor data and identify a conductor state as one of normal and abnormal.

12. The device of claim 11, wherein the monitoring sensor is configured to monitor a characteristic of the conductor comprising at least one of: a temperature of the conductor, a temperature proximate the conductor, a wind speed proximate the conductor, acceleration of the conductor, an acoustic of the conductor, and a sag of the conductor.

13. A fault monitoring system, comprising:
   a conductor mounted device (CMD) to be coupled to a first conductor of an electric power system, the CMD including:
      a mounting device to mount the CMD to the first conductor;
      a CMD current transformer to measure a current in the first conductor;
      a fault detector in communication with the current transformer to detect a fault in the first conductor; and
      a transmitter to wirelessly transmit:
         a fault signal indicating that a fault has been detected in response to detection of a fault by the fault detector, and
         a heartbeat signal on a periodic basis independent of the fault signal; and
   an intelligent electronic device (IED) to receive communications from the CMD and implement at least one protective action, the IED including:
      a receiver to receive the transmitted signal from the CMD indicating that a fault has been detected on the first conductor;
      an IED current transformer monitoring a current on a second conductor electrically connected to the first conductor; and
      a protective action component to determine a protective action to be taken based on the monitored current on the second conductor from the IED current transformer and the fault signal from the CMD.

14. The system of claim 13, wherein the CMD current transformer comprises a pole piece that extends from a body of the CMD proximate the conductor, and wherein the CMD current transformer is configured to parasitically produce a secondary current proportional to the current in the first conductor.

15. The system of claim 14, wherein the parasitically produced secondary current is used to power the CMD obviating the need for direct external power.

16. The system of claim 15, wherein the parasitically produced secondary current is used to charge a power store, and wherein the power store is configured to continue to provide power to at least a portion of the CMD upon a loss of load current (LOC) event of the first conductor.

17. The system of claim 16, wherein the CMD further includes a rectifier and wherein the power store comprises at least one of a capacitor and a battery.

18. The system of claim 13, wherein the transmitter comprises a wireless RF transmitter, and wherein the CMD further includes an antenna connected to the transmitter.

19. The system of claim 13, wherein the CMD further comprises a heartbeat generator to send, via the transmitter, a heartbeat signal to the IED on an established periodic basis confirming an operational state of the CMD, and wherein the IED is configured to alarm in the event a predetermined number of heartbeat signals are not received from the CMD per the periodic basis.

20. A method for identifying a fault, comprising:
   securing a conductor mounted device to a conductor of an electric power system;
   producing, via a current transformer, a secondary current for use by the conductor mounted device that is proportional to a primary current in the conductor;
   transmitting, via a transmitter, a heartbeat signal periodically to indicate that the conductor mounted device is functional;
   determining a state of the conductor as at least one of a loss of load current (LOC) state and a fault state; and
   transmitting the state of the conductor to a protective intelligent electronic device (IED) in response to a change in the state of the conductor independent of the heartbeat signal.

21. The method of claim 20, further comprising:
   powering the transmitter using power from the secondary current produced by the current transformer.

22. The method of claim 21, further comprising:
   storing a portion of the secondary current in a power store, wherein the power store is used to continue to supply power to the transmitter during a LOC state.

23. The method of claim 22, further comprising:
   rectifying at least the portion of the secondary current before storing it in the power store, and wherein the power store comprises at least one of a capacitor and a battery.

* * * * *